US006586152B1

(12) United States Patent
Urano et al.

(10) Patent No.: US 6,586,152 B1
(45) Date of Patent: Jul. 1, 2003

(54) AGENT FOR REDUCING SUBSTRATE DEPENDENCE

(75) Inventors: Fumiyoshi Urano, Saitama (JP); Naoki Katano, Saitama (JP); Tomoko Kiryu, Saitama (JP)

(73) Assignee: Wako Pure Chemical Industries, Ltd., Osaka (JP)

( * ) Notice: Subject to any disclaimer, the term of this patent is extended or adjusted under 35 U.S.C. 154(b) by 0 days.

(21) Appl. No.: 09/592,851

(22) Filed: Jun. 12, 2000

(30) Foreign Application Priority Data

Jun. 10, 1999 (JP) ............................ 11-163191
Jun. 10, 1999 (JP) ............................ 11-285662

(51) Int. Cl.$^7$ .......................... G03F 7/004; G03F 7/039
(52) U.S. Cl. .................... 430/170; 430/270.1; 430/905; 430/910
(58) Field of Search .............................. 430/270.1, 905, 430/170, 910

(56) References Cited

U.S. PATENT DOCUMENTS

| 5,350,660 A |   | 9/1994  | Urano et al. ................ 430/176 |
| 5,352,564 A |   | 10/1994 | Takeda et al. ............... 430/270 |
| 5,627,006 A |   | 5/1997  | Urano et al. ................ 430/192 |
| 5,629,135 A | * | 5/1997  | Kobayashi et al. ......... 430/176 |
| 5,670,299 A |   | 9/1997  | Urano et al. ................ 430/326 |
| 5,736,296 A |   | 4/1998  | Sato et al. ............... 430/270.1 |
| 5,846,689 A | * | 12/1998 | Schwalm et al. ......... 430/270.1 |
| 5,849,457 A | * | 12/1998 | Namba et al. ............... 430/191 |
| 5,849,461 A |   | 12/1998 | Hatakeyama et al. ..... 430/281.1 |
| 5,854,357 A |   | 12/1998 | Sato et al. ............... 525/359.3 |
| 5,866,299 A | * | 2/1999  | Szmanda et al. ......... 430/270.1 |
| 5,880,169 A |   | 3/1999  | Osawa et al. |
| 5,914,219 A |   | 6/1999  | Funhoff et al. ............. 430/326 |
| 5,916,729 A |   | 6/1999  | Kobayashi et al. |
| 5,942,367 A |   | 8/1999  | Watanabe et al. ........... 430/170 |
| 5,955,240 A | * | 9/1999  | Sato et al. .................. 430/170 |
| 5,972,559 A |   | 10/1999 | Watanabe et al. ........ 430/270.1 |
| 6,030,746 A |   | 2/2000  | Nagata et al. |
| 6,042,988 A |   | 3/2000  | Sato et al. .................. 430/270 |

FOREIGN PATENT DOCUMENTS

| EP | 0 634 696 A1     | 1/1995  |
| EP | 0 742 789 A1     | 11/1996 |
| EP | 0 742 488 A2 A3  | 11/1996 |
| EP | 0 779 522 A2 A3  | 6/1997  |
| EP | 0 780 732 A2 A3  | 6/1997  |

(List continued on next page.)

OTHER PUBLICATIONS

*Merck Index, Eleventh Edition*, 1998, Merck & Co., Inc., Rahway, NJ, S. Budvari, XP002147232, p. 958, Column 1, Lines 37–47, *Methyl Isothiocyanate*.

Primary Examiner—John S. Chu
(74) Attorney, Agent, or Firm—Armstrong, Westerman & Hattori, LLP

(57) ABSTRACT

The present invention relates to an agent for reducing substrate dependence useful as an ingredient of a resist composition used for preparation of semiconductor devices and the like, which comprises a compound shown by the following general formula [1]:

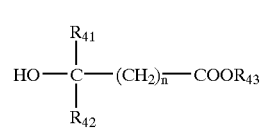

wherein $R_{41}$ is a hydrogen atom or a methyl group, $R_{42}$ is a hydrogen atom, a methyl group, an ethyl group or a phenyl group, $R_{43}$ is a straight chained, branched or cyclic alkyl group having 1 to 6 carbon atoms, and n is 0 or 1.

40 Claims, 3 Drawing Sheets

FOREIGN PATENT DOCUMENTS

| | | |
|---|---|---|
| EP | 0 848 290 A1 | 6/1998 |
| EP | 0 908 473 A1 | 4/1999 |
| EP | 0 959 389 A1 | 11/1999 |
| EP | 0 562 819 | 12/1999 |
| EP | 1 024 406 A1 | 8/2000 |
| JP | 3-223862 | 10/1991 |
| JP | 3-223865 | 10/1991 |
| JP | 5-249682 | 9/1993 |
| JP | 5-265213 | 10/1993 |
| JP | 6-11836 | 1/1994 |
| JP | 6-32817 | 2/1994 |
| JP | 6-161112 | 6/1994 |
| JP | 6-167811 | 6/1994 |
| JP | 7-28230 | 1/1995 |
| JP | 7-28247 | 1/1995 |
| JP | 7-140666 | 6/1995 |
| JP | 8-179508 | 7/1996 |
| JP | 8-211598 | 8/1996 |
| JP | 8-262721 | 10/1996 |
| JP | 9-160247 | 6/1997 |
| JP | 9278699 | 11/1997 |
| JP | 10-20504 | 1/1998 |
| JP | 10-207066 | 8/1998 |
| JP | 10207066 | 8/1998 |
| JP | 11-44950 | 2/1999 |

* cited by examiner

AGENT FOR REDUCING SUBSTRATE DEPENDENCE

BACKGROUND OF THE INVENTION

The present invention relates to a compound useful as an ingredient of a resist composition used for preparation of semiconductor elements and the like, which can reduce substrate dependence of the resist composition, and to a resist composition in which the compound is incorporated.

In compliance with the requirement for ultra-fine processing according to high integration of semiconductor devices, the light source of exposure used in lithography processes has recently been changed from i-line (365 nm) to one having shorter wavelength such as KrF excimer laser (248 nm), ArF excimer laser (193 nm) or electron beam. In accordance with the change from high-pressure mercury lump to excimer laser as the exposure source, the resist composition to be used is required to be high sensitive and thus so-far used dissolution-inhibiting resist has been replaced by a chemically-amplified resist composition. In chemically-amplified resist compositions, an action of an acid generated by actinic radiation takes an important role, and therefore influence by the kind of the substrate is often observed, which has not been come into matter in dissolution-inhibiting resist compositions. Namely, in a case of a special substrate such as SiN, TiN, SiON, BPSG and a strong basic organic anti-reflective film, a basic substance and water generated from those substrate inactivate the generated acid on their surface, and consequently no good pattern can be obtained. For this reason, this substrate dependence has been a serious problem in production of semiconductor, devices. In order to dissolve this problem in chemically-amplified resist compositions, there have been proposed use of an organic carboxylic acid such as salicylic acid (e.g. Japanese Patent Publication-Kokai-No. 262721/1996, No. 160247/1997), use of an organic carboxylic acid such as diphenolic acid (e.g. Japanese Patent Publication-Kokia-No. 207066/1998, No. 20504/1998) or an imide compounds such as succinimide (e.g. Japanese Patent Publication-Kokai-No. 44950/1999) and the like. However, addition of salicylic acid, etc. causes a problem concerning stability of a resist solution, and addition of diphenolic acid causes such a problem that almost no reduction of substrate dependence is attained. Further, addition of succinimide, etc. can attain reduction of substrate dependence on some kind of substrates but the reduction is still not enough. Such being the circumstances, it has strongly been desired to develop such chemically-amplified resist composition as capable of forming a rectangular pattern even on a specific substrate just like on an ordinary substrate including an oxide film substrate and organic anti-reflective film (namely no substrate dependence is observed) and being excellent in dimension adjustability and solution stability.

SUMMARY OF THE INVENTION

Under the situation, the problem to be solved by the present invention is to provide a resist composition which can form a rectangular pattern even on a special substrate such as SiN, TiN, SiON, BPSG and a strong basic organic anti-reflective film and is excellent in dimension adjustability and solution stability.

For the purpose of attaining the object mentioned above, the present invention comprises the following embodiments.

(1) An agent for reducing substrate dependence of a resist composition, which comprises a compound shown by the following general formula [1]:

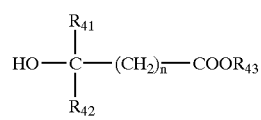

[1]

wherein $R_{41}$ is a hydrogen atom or a methyl group, $R_{42}$ is a hydrogen atom, a methyl group, an ethyl group or a phenyl group, $R_{43}$ is a straight chained, branched or cyclic alkyl group having 1 to 6 carbon atoms, and n is 0 or 1.

(2) A method for reducing substrate dependence of a resist composition, which comprises incorporating as an agent for reducing substrate dependence a compound shown by the following general formula [1]:

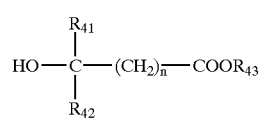

[1]

wherein $R_{41}$, $R_{42}$, $R_{43}$ and n have the same meaning as above.

(3) A resist composition, which comprises a) a compound shown by the following general formula [1]:

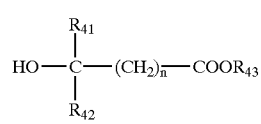

[1]

wherein $R_{41}$, $R_{42}$, $R_{43}$ and n have the same meaning as above, b) a polymer which becomes soluble in an aqueous alkaline developing solution by a chemical change by an action of an acid, and c) an acid generator (hereinafter abbreviated as the resist composition-1 of the present invention).

(4) A resist composition, which comprises a) a compound shown by the following general formula [1]:

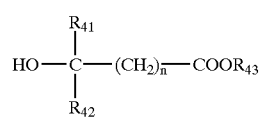

[1]

wherein $R_{41}$, $R_{42}$, $R_{43}$ and n have the same meaning as above, b) a polymer soluble in an aqueous alkaline developing solution, c) an acid generator, and d) a compound which becomes soluble in an aqueous alkaline developing solution by a chemical change by an action of an acid (hereinafter abbreviated as the resist composition-2 of the present invention).

(5) A resist composition, which comprises a) a compound shown by the following general formula [1]:

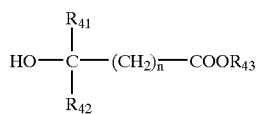

[1]

wherein $R_{41}$, $R_{42}$, $R_{43}$ and n have the same meaning as above, b) a polymer soluble in an aqueous alkaline developing solution, c) an acid generator, and d) a cross-linking compound which can make a polymer hardly soluble in an aqueous alkaline developing solution by a chemical change by an action of an acid (hereinafter abbreviated the resist composition-3 of the present invention).

DETAILED DESCRIPTION OF THE PREFERRED EMBODIMENTS

Figure 1:
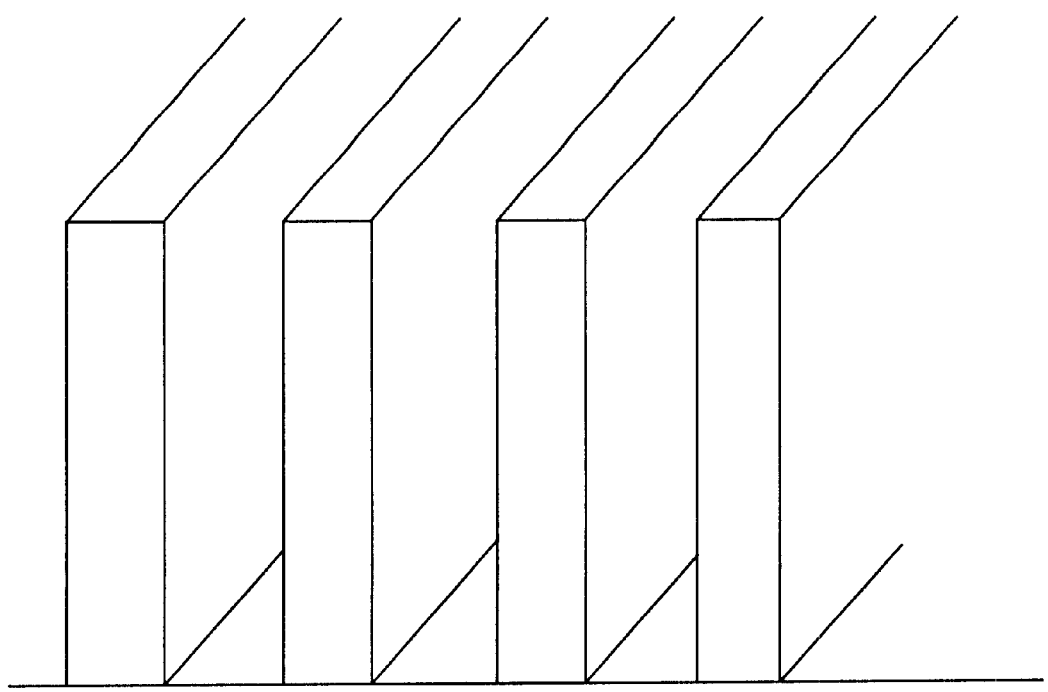
FIG. 1 shows a cross-section view of positive tone patterns obtained in Examples 1 to 8, which are such good as a rectangular shape without footing.

The straight chained, branched or cyclic alkyl group having 1 to 6 carbon atoms shown by $R_{43}$ in the general formula [1] of the present invention includes a methyl group, an ethyl group, an n-propyl group, an isopropyl group, a cyclopropyl group, an n-butyl group, an isobutyl group, a sec-butyl group, a tert-butyl group, an n-pentyl group, an isopentyl group, a cyclopentyl group, an n-hexyl group, a cyclohexyl group, etc.

Specific examples of the compound shown by the general formula [1] of the present invention are methyl glycolate, ethyl glycolate, n-propyl glycolate, isopropyl glycolate, n-butyl glycolate, isobutyl glycolate, tert-butyl glycolate, n-pentyl glycolate, isopentyl glycolate, n-hexyl glycolate, cyclohexyl glycolate, methyl lactate, ethyl lactate, n-propyl lactate, isopropyl lactate, n-butyl lactate, tert-butyl lactate, n-pentyl lactate, isopentyl lactate, methyl 3-hydroxypropionate, ethyl 3-hydroxypropionate, n-propyl 3-hydroxypropionate, methyl 2-hydroxybutyrate, ethyl 2-hydroxybutyrate, n-propyl 2-hydroxybutyrate, methyl 2-hydroxyisobutyrate, ethyl 2-hydroxyisobutyrate, methyl 3-hydroxybutyrate, ethyl 3-hydroxybutyrate, methyl 3-hydroxyvalerate, ethyl 3-hydroxyvalerate, methyl mandelate, ethyl mandelate, n-propyl mandelate, isopropyl mandelate, etc.

In the compounds shown by the general formula [1] of the present invention, methyl glycolate, ethyl glycolate, ethyl lactate, n-propyl lactate, methyl 2-hydroxybutyrate, ethyl 2-hydroxybutyrate, methyl 3-hydroxybutyrate, ethyl 3-hydroxybutyrate, methyl mandelate, ethyl mandelate, etc. are preferable because they are required to be used only in a small amount for reducing substrate dependence and thus control of film thickness can easily be conducted, among which methyl glycolate, ethyl glycolate, ethyl lactate, methyl 3-hydroxybutyrate, ethyl 3-hydroxybutyrate and ethyl mandelate are particularly preferable.

The compound shown by the general formula [1] of the present invention can be commercially available and also can easily be obtained by heat treatment of the corresponding hydroxy carboxylic acid and alcohol in the presence of a strong acid catalyst.

It has been reported that ethyl lactate (ethyl 2-hydroxypropionate), methyl lactate (methyl 2-hydroxypropionate), n-propyl butyrate, ethyl glycolate (ethyl hydroxyacetate), methyl 2-hydroxy-2-methylbutyrate, ethyl 3-hydroxypropionate, ethyl 2-hydroxyisobutyrate, methyl 4-hydroxybutyrate, ethyl 4-hydroxybutyrate, etc. are alone or in combination (at a 50:50% ratio) used as a solvent for resist composition (e.g. Japanese Patent Publication-Kokai-Nos. 249682/1993, 11836/1994, 32817/1994, 28247/1995, 140666/1995, 179508/1996, 211598/1996, etc.), but there has been found no report that those compounds are used as an agent for reducing substrate dependence as in the present invention. Further it has been pointed out that when those hydroxyalkylcarboxylic acid esters are used as the main solvent, there are observed problems concerning storage stability as well as poor in control of film thickness and poor adhesion of substrate (e.g. Japanese Patent Publication-Kokai-No. 11836/1994, etc.).

An amount of the compound shown by the general formula [1] of the present invention to be used is preferably 0.5 to 30 wt %, more preferably 2 to 20 wt %, still more preferably 3 to 15 wt %, relative to the total amount of the resist composition. Namely, when it is less than 0.5 wt %, effect of reduction of substrate dependence is not enough and thus footing pattern is observed, while use in an amount more than 30 wt % is not preferable, because adjustability of film thickness (coating homogeneity) is poor and thus dimension is varied on a different level substrate and pattern is peeled off and further due to poor stability of the solution, there are caused such problems as variable sensitivity and dimension according to the time lapse.

The compound shown by the general formula [1] of the present invention may be used alone or in a suitable combination of two or more thereof.

When used in a suitable combination of two or more of the compounds, a total amount of the compounds is preferably 0.5 to 30 wt %, more preferably 2 to 20 wt %, still more preferably 3 to 15 wt %, relative to the total amount of the resist composition.

A resist composition contains a polymer as one of the essential ingredients. The polymer to be used is grouped into two category, one being one itself soluble in an aqueous alkaline developing solution, and the other being one becoming soluble in an aqueous alkaline developing solution by a chemical change by an action of an acid. When the former type is used, a compound which becomes soluble in an aqueous alkaline developing solution by a chemical change by an action of an acid or a cross-linking compound which can make a polymer hardly soluble in an aqueous alkaline developing solution by a chemical change by an action of an acid is co-used in order to regulate the solubility, so that a pattern can be formed, and in order to generate the acid, an acid generator is also used. On the other hand, when the latter type is used, an acid generator is used so that an acid is generated from the acid generator and thus generated acid acts upon the polymer in order to make the polymer soluble in aqueous alkaline developing solution.

The agent for reducing substrate dependence of the present invention can be used in the above three cases.

The polymer which becomes soluble in an aqueous alkaline developing solution by a chemical change by an action of an acid mentioned above (hereinafter abbreviated as a polymer having an acid labile group) includes one shown by the general formula [2] or [3];

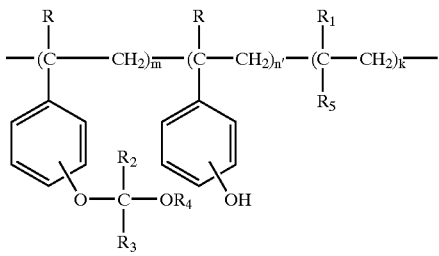

[2]

wherein R and $R_1$ are independently a hydrogen atom or a methyl group, $R_2$ and $R_3$ are independently a hydrogen atom, a lower alkyl group or an aryl group, except for the case where $R_2$ and $R_3$ are both hydrogen atoms, and $R_2$ and $R_3$ may form together an alkylene ring; $R_4$ is a lower alkyl group or an aralkyl group; $R_5$ is a cyano group, a carboxylic group which may be esterified or a phenyl group which may be substituted; m and n' are a natural number; and k is 0 or a natural number, provided that m>k;

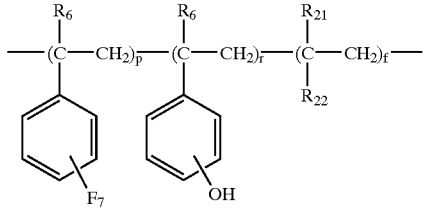

[3]

wherein $R_6$ and $R_{21}$ are independently a hydrogen atom or a methyl group; $R_7$ is a hydrogen atom, a lower alkyl group, a lower alkoxy group, an acyloxy group, a 5- to 6-membered saturated heterocyclic oxy group or a group shown by the formula of $R_8O—CO—(CH_2)z—O—$ in which $R_8$ is an alkyl group and z is 0 or a natural number; $R_{22}$ is a cyano group, a phenyl group which may have a substituent or a carboxyl group which may be esterified; p and r are natural number; f is 0 or a natural number, provided that p>f; with the proviso that when $R_7$ is a hydrogen atom, a lower alkyl group, a lower alkoxy group except for one which is easily changed into a hydroxy group by an acid, an acyloxy group or a group $R_8O—CO—(CH_2)z—O—$ (in which $R_8$ and z have the same meaning as above) except for a case where $R_8$ is a group labile by an acid, $R_{22}$ is a phenyl group having a substituent which is easily changed into a hydroxy group or a group of $—COOR_{45}$ (in which $R_{45}$ is an alkyl group labile by an acid) and that when $R_7$ is an alkoxy group which is easily changed into a hydroxy group, a 5- to 6-membered saturated oxy group or a group of $R_8O—CO—(CH_2)z—O—$ (in which $R_8$ and z have the same meaning as above) in which $R_8$ is labile by an acid, $R_{22}$ is a cyano group, a phenyl group which may have a substituent or a carboxyl group which may be esterified.

In the above polymer, when a content of the hydroxystyrene units is high, the polymer itself is soluble in an aqueous alkaline developing solution, while it is low, the polymer itself is insoluble and by an action of an acid, it becomes soluble.

When the content of the hydroxystyrene unit shown by a ratio (n')/(m+n'+k) in the compound [2] and (r)/(p+r+f) in the compound [3] is less than about 0.8, preferably less than about 0.7, more preferably less than 0.6, the polymer is insoluble in an aqueous alkaline developing solution and when the content of the hydroxystyrene unit shown by a ratio (n')/(m+n'+k) in the compound [2] and (r)/(p+r+f) in the comound [3] is more than about 0.6, preferably more than about 0.7, more preferably more than about 0.8, still more preferably more than 0.9, the polymer is soluble in an aqueous developing solution.

The lower alkyl group shown by $R_2$, $R_3$ and $R_4$ in the general formula [2] may be straight chained, branched or cyclic and it is preferably one having 1 to 10 carbon atoms, which is specifically exemplified by a methyl group, an ethyl group, an n-propyl group, an isopropyl group, a cyclopropyl group, an n-butyl group, an isobutyl group, a tert-butyl group, a sec-butyl group, an n-pentyl group, an isopentyl group, a tert-pentyl group, an 1-methylpentyl group, a cyclopentyl group, an n-hexyl group, an isohexyl group, a cyclohexyl group, a 2-cyclohexylethyl gourp, a cyclohexylmethyl group, a heptyl group, an octyl group, a nonyl group, a decyl group, etc.

The aryl group shown by $R_2$ and $R_3$ is specifically exemplified by a phenyl group, a naphtyl group, etc.

The alkylene ring which may be formed together by $R_2$ and $R_3$ is preferably one having 3 to 6 carbon atoms, which is specifically exemplified by a propylene ring, a butylene ring, a pentylene ring, a hexylene ring, etc.

The aralkyl group shown by $R_4$ is specifically exemplified by a benzyl group, a phenethyl group, a phenylpropyl group, a methylbenzyl group, a methylphenetyl group, an ethylbenzyl group, etc.

The carboxyl group which may be esterified shown by $R_5$ in the general formula [2] is exemplified by a carboxyl group, one in which a hydrogen atom of a carboxyl group is substituted by an alkyl group having 1 to 6 carbon atoms, such as a methoxycarbonyl group, an ethoxycarbonyl group, an n-propoxycarbonyl group, an isopropoxycarbonyl group, an n-butoxycarbonyl group, an isobutoxycarbonyl group, a sec-butoxycarbonyl group, a tert-butoxycarbonyl group, an n-pentyloxycarbonyl group, a tert-pentyloxycarbonyl group, an n-hexyloxycarbonyl group and a cyclohexyloxycarbonyl group, one in which a hydrogen atom of a carbonyl group is substituted by a bridged alicyclic hydrocarbon residue having 7 to 9 carbon atoms, such as a norbornyloxycarbonyl group, an isobornyloxycarbonyl group, etc.

The substituent of the phenyl group which may be substituted shown by $R_5$ is exemplified by straight chained, branched or cyclic alkyl group, preferably one having 1 to 10 carbon atoms such as a methyl group, an ethyl group, an n-propyl group, an isopropyl group, a cyclopropyl group, an n-butyl group, an isobutyl group, a tert-butyl group, a sec-butyl group, an n-pentyl group, an isopentyl group, a tert-pentyl group, an 1-methylpentyl group, a cyclopentyl group, an n-hexyl group, an isohexyl group, a cyclohexyl group, a heptyl group, an octyl group, a nonyl group and a decyl group; a straight chained or branched alkoxy group, preferably one having 1 to 6 carbon atoms, such as a methoxy group, an ethoxy group, an n-propoxy group, an isopropoxy group, an n-butoxy group, an isobutoxy group, a tert-butoxy group, a sec-butoxy group, an n-pentyloxy group, an isopentyloxy group, an n-hexyloxy group and an isohexyloxy group; a straight chained, branched or cyclic acyl group originated from a carboxylic acid having 2 to 7 carbon atoms such as an acetyl group, a propionyl group, an n-butyryl group, an isobutyryl group, an n-pentanoyl group, a pivaloyl group, an isovaleryl group and a cyclohexane carbonyl group; a 5- to 6-membered saturated heterocyclic oxy group such as tetrahydrofuranyloxy group and tetrahydropyranyloxy group, and a group shown by the formula of $R_{25}O$—CO—$(CH_2)jO$— wherein $R_{25}$ and j have the same meaning as above. The acid labile lower alkyl group shown by $R_{25}$ may be branched or cyclic one having 4 to 7 carbon atoms, such as a tert-butyl group, a tert-pentyl group, a 1-methylcyclopentyl group and a 1-methylcyclohexyl group. The specific examples of the group shown by the formula $R_{25}O$—CO—$(CH_2)jO$— are a tert-butoxycarbonyloxy group, a tert-pentyloxycarbonyloxy group, a tert-butoxycarbonylmethoxy group, an 1-methylcyclopentyloxycarbonylmethoxy group, a 1-methylcyclohexyloxycarbonylmethoxy group, etc.

The lower alkyl group shown by $R_7$ in the general formula [3] includes preferably straight chained, branched or cyclic one having 1 to 6 carbon atoms, such as a methyl group, an ethyl group, an n-propyl group, an isopropyl group, a cyclopropyl group, an n-butyl group, an isobutyl group, a tert-butyl group, a sec-butyl group, an n-pentyl group, an isopentyl group, a tert-pentyl group, a cyclopentyl group, an n-hexyl group, a 1-methylpentyl group, an isohexyl group and a cyclohexyl group.

The alkoxy group shown by $R_7$ includes preferably straight chained, branched or cyclic one having 1 to 7 carbon atoms, such as a methoxy group, an ethoxy group, an n-propoxy group, an isopropoxy group, an n-butoxy group, an isobutoxy group, a tert-butoxy group, a sec-butoxy group, an n-pentyloxy group, an isopentyloxy group, a tert-pentyloxy group, an n-hexyloxy group, a 1-methylcyclopentyloxy group, an isohexyloxy group, a heptyloxy group and a 1-methylcycloheyxoxy group.

The acyloxy group shown by $R_7$ includes preferably straight chained, branched or cyclic one having 2 to 7 carbon atoms derived from carboxylic acids, such as an acetyloxy group, a propionyloxy group, an n-butyryloxy group, an isobutyryloxy group, an n-pentanoyloxy group, a pivaloyloxy group, an isovarelyloxy group and a cyclohexanecarbonyloxy group.

The saturated heterocyclic oxy group shown by $R_7$ is preferably 5- to 6-membered one such as a tetrahydrofuranyloxy group and a tetrahydropyranyloxy group.

$R_8$ in $R_8O$—CO—$(CH_2)z$—O— includes a straight chained, branched or cyclic alkyl group having 1 to 8 carbon atoms, such as a methyl group, an ethyl group, an n-propyl group, an isopropyl group, a cyclopropyl group, an n-butyl group, an isobutyl group, a tert-butyl group, a sec-butyl group, an n-pentyl group, an isopentyl group, a 1-methylcyclohexyl group, a tert-pentyl group, a 1-methylcyclopentyl group, a cyclopentyl group, an n-hexyl group, an isohexyl group, a cyclohexyl group, a heptyl group and an octyl group, and the specific examples of the group $R_8O$—CO—$(CH_2)z$—O— are a methoxycarbonyloxy group, an ethoxycarbonyloxy group, an isopropoxycarbonyloxy group, an isobutoxycarbonyloxy group, a tert-butoxycarbonyloxy group, a tert-pentyloxycarbonyloxy group, a 1-methylcyclohexyloxycarbonylmethoxy group, a tert-butoxycarbonylmethoxy group and a 1-methylcyclopentyloxycarbonylmethoxy group.

The substituent of the phenyl group which may have a substituent shown by $R_{22}$ is exemplified by straight chained, branched or cyclic alkyl group, preferably one having 1 to 6 carbon atoms such as a methyl group, an ethyl group, an n-propyl group, an isopropyl group, a cyclopropyl group, an n-butyl group, an isobutyl group, a tert-butyl group, a sec-butyl group, an n-pentyl group, an isopentyl group, a tert-pentyl group, a 1-methylpentyl group, a cyclopentyl group, an n-hexyl group, an isohexyl group and a cyclohexyl group; a straight chained, branched or cyclic alkoxy group, preferably one having 1 to 7 carbon atoms, such as a methoxy group, an ethoxy group, an n-propoxy group, an isopropoxy group, an n-butoxy group, an isobutoxy group, a tert-butoxy group, a sec-butoxy group, an n-pentyloxy group, an isopentyloxy group, a tert-pentyloxy group, a 1-methylcyclopentyloxy group, an n-hexyloxy group, an isohexyloxy group, a heptyloxy group and a 1-methylcyclohexyloxy group; a straight chained, branched or cyclic acyloxy group, preferably one having 2 to 7 carbon atoms such as an acetyloxy group, a propionyloxy group, an n-butyryloxy group, an isobutyryloxy group, an n-pentanoyloxy group, a pivaloyloxy group, an isovaleryloxy group and a cyclohexane carbonyloxy group; a 5- to 6-membered saturated heterocyclic oxy group such as tetrahydrofuranyloxy group and tetrahydropyranyloxy group; and a group shown by the formula of $R_{25}O$—CO—$(CH_2)jO$— wherein $R_{25}$ and j have the same meaning as above, such as a tert-butoxycarbonyloxy group, a tert-pentyloxycarbonyloxy group, a tert-butoxycarbonylmethoxy group, a tert-pentyloxycarbonylmethyloxy group, a 1-methylcyclohexyloxycarbonylmethoxy group and a 1-methylcyclopentyloxycarbonylmetoxy group.

The carboxylic group which may be esterified shown by $R_{22}$ is exemplified by a carboxyl group, one in which a hydrogen atom of a carboxyl group is substituted by an alkyl group having 1 to 6 carbon atoms, which is specifically exemplified by a methoxycarbonyl group, an ethoxycarbonyl group, an n-propoxycarbonyl group, an isopropoxycarbonyl group, an n-butoxycarbonyl group, an isobutoxycarbonyl group, a sec-butoxycarbonyl group, a tert-butoxycarbonyl group, an n-pentyloxycarbonyl group, a tert-pentyloxycarbonyl group, an n-hexyloxycarbonyl group and a cyclohexyloxycarbonyl group, one in which a hydrogen atom of a carbonyl group is substituted by a bridged alicyclic hydrocarbon residue having 7 to 9 carbon atoms, such as a norbornyloxycarbonyl group and an isobornyloxycarbonyl group, etc.

Among the alkoxy group shown by $R_7$, one which can easily be converted to a hydroxy group by an act of an acid includes a tert-butoxy group, a tert-pentyloxy group, a 1-methylcyclopentyloxy group and a 1-methylcyclohexyloxy group.

The alkyl group shown by $R_8$ in the formula $R_8O$—CO—$(CH_2)z$—O— which is easily removed by an act of an acid includes a tert-butyl group, a 1-methylcyclohexyl group, a tert-pentyl group, a 1-methylcyclopentyl group, etc.

The substituent in the substituted phenyl group shown by $R_{22}$ which is easily converted to a hydroxy group by an act of an acid includes a tert-butoxy group, a tert-pentyloxy group, a 1-methylcyclopentyloxy group, a 1-methylcyclohexyloxy group, a tetrahydrofuranyloxy group, a tetrahydropyranyloxy group, a tert-butoxycarbonyloxy group, a tert-pentyloxycarbonyloxy group, a tert-butoxycarbonylmethoxy group, a tert-pentyloxycarbonylmethoxy group, a 1-methylcyclohexyloxycarbonylmethoxy group, a 1-methylcyclopentyloxycarbonylmethoxy group, etc. The alkyl group shown by $R_{45}$ in the formula of —COOR$_{45}$ shown by $R_{22}$ which is easily removed by an act of an acid includes a tert-butoxycarbonyl group, a tert-pentyloxycarbonyl group, etc.

The specific examples of the compound shown by the general formula [2] or [3] are poly(p-tert-butoxystyrene/p- hydroxystyrene), poly(p-tetrahydropyranyloxystyrene/p-hydroxystyrene), poly(p-tert-butoxycarbonyloxystyrene/p-hydroxystyrene), poly(p-1-methoxy-1-methylethoxystyrene/p-hydroxystyrene), poly(p-1-methoxyethoxystyrene/p-hydroxystyrene), poly(p-1-ethoxyethoxystyrene/p-hydroxystyrene), poly(p-1-ethoxypropoxystyrene/p-hydroxystyrene), poly(p-α-ethoxy-4-methylbenzyloxystyrene/p-hydroxystyrene), poly(p-α-ethoxybenzyloxystyrene/p-hydroxystyrene), poly(p-1-ethoxyethoxystyrene/p-tert-butoxystyrene/p-hydroxystyrene), poly(p-1-ethoxyethoxystyrene/p-isopropoxystyrene/p-hydroxystyrene), poly(p-1-ethoxyethoxystyrene/p-tert-butoxycarbonyloxystyrene/p-hydroxystyrene), poly(p-1-ethoxyethoxystyrene/p-tetrahydropyranyloxystyrene/p-hydroxystyrene), poly(p-1-ethoxyethoxystyrene/p-pivarolyloxystyrene/p-hydroxystyrene), poly(p-1-ethoxyethoxystyrene/p-benzoyloxystyrene/p-hydroxystyrene), poly(p-1-ethoxypropoxystyrene/p-tert-butoxystyrene/p-hydroxystyrene), poly(p-1-ethoxypropoxystyrene/p-tert-butoxycarbonyloxystyrene/p-hydroxystyrene), poly(p-1-cyclohexyloxyethoxystyrene/p-tetrahydropyranyloxystyrene/p-hydroxystyrene), poly(p-1-cyclohexyloxyethoxystyrene/p-tert-butoxystyrene/p-hydroxystyrene), poly(p-1-cyclohexyloxyethoxystyrene/p-tert-butoxycarbonyloxystyrene/p-hydroxystyrene), poly[p-1-(2-cyclohexylethoxy)ethoxystyrene/p-acetyloxystyrene/p-hydroxystyrene], poly[p-1-(2-cyclohexylethoxy)ethoxystyrene/p-tert-butoxyxtyrene/p-hydroxystyrene], poly(p-1-cyclohexylmethoxyethoxystyrene/p-tert-butoxystyrene/p-hydroxystyrene), poly(p-1-ethoxyethoxystyrene/styrene/p-hydroxystyrene), poly(p-1-ethoxyethoxystyrene/p-hydroxystyrene/cyclohexyl acrylate), poly(p-1-ethoxyethoxystyrene/p-hydroxystyrene/cyclohexyl methacrylate), poly(p-1-ethoxyethoxystyrene/p-tert-butoxycarbonylmethoxystyrene/p-hydroxystyrene), poly(p-1-ethoxyethoxystyrene/p-hydroxystyrene/isobornyl acrylate), poly(p-1-ethoxyethoxystyrene/p-hydroxystyrene/norbornyl methacrylate), poly(p-1-ethoxypropoxystyrene/p-hydroxystyrene/isobornyl acrylate), poly(p-1-ethoxypropoxystyrene/p-hydroxystyrene/p-tert-butylstyrene), poly(p-1-cyclohexyloxyethoxystyrene/p-hydroxystyrene/isobornyl acrylate), poly(p-hydroxystyrene/styrene/tert-butyl acrylate), poly(p-hydroxystyrene/styrene/tert-butyl methacrylate), and partially cross-linked polymers thereof, etc.

The polymer having an acid labile group which is used in the resist composition of the present invention includes those composed of three kinds of monomer units as shown by the above general formula [2] or [3] and also those composed of four kinds of monomer units such as poly(p-1-ethoxyethoxystyrene/styrene/p-hydroxystyrene/tert-butyl acrylate) and poly(p-1-ethoxyethoxystyrene/styrene/p-hydroxystyrene/tert-butyl methacrylate).

Those polymers may be used alone or in combination of two or more thereof.

The specific examples of the polymer soluble in an aqueous alkaline developing solution used in the resist composition-2 or -3 of the present invention are poly(p-hydroxystyrene), poly(styrene/p-hydroxystyrene) [among them, one having a ratio of styrene units to p-hydroxystyrene units is limited to 4 or less:6 or more (such a ratio is hereinafter represented by 4↓:6↑) is preferable], poly(p-tert-butoxystyrene/p-hydroxystyrene) [among them, one having a ratio of p-tert-butoxystyrene units to p-hydroxystyrene units of 2↓:8↑ is preferable], poly(p-isopropoxystyrene/p-hydroxystyrene) [among them, one having p-isopropoxystyrene units to p-hydroxystyrene units of 2↓:8↑ is preferable], poly(p-tetrahydropyranyloxystyrene/p-hydroxystyrene) [among them, one having p-tetrahydropyranyloxystyrene units to p-hydroxystyrene units of 2↓:8↑ is preferable], poly (tert-butoxycarbonyloxystyrene/p-hydroxystyrene) [among them, one having tert-butoxycarbonyloxystyrene units to p-hydroxystyrene units of 2↓:8↑ is preferable], poly(p-1-ethoxyethoxystyrene/p-hydroxystyrene) [among them, one having p-1-ethoxyethoxystyrene units to p-hydrdoxystyrene units of 2↓:8↑ is preferable], poly(p-1-ethoxyethoxystyrene/p-tert-butoxystyrene/p-hydroxystyrene) [among them, one having a ratio of the sum of p-1-ethoxyethoxystyrene units and p-tert-butoxystyrene units to p-hydroxystyrene units of 2↓:8↑ is preferable], poly(p-1-ethoxyethoxystyrene/styrene/p-hydroxystyrene) [among them, one having a ratio of the sum of p-1-ethoxyethoxystyrene units and styrene units to p-hydroxystyrene units of 2↓:8↑ is preferable], poly(p-hydroxystyrene/styrene/tert-butyl acrylate) [among them, one having a ratio of p-hydroxystyrene units to the sum of styrene units and tert-butyl acrylate units of 7↑:3↓ is preferable], poly(p-hydroxystyrene/styrene/tert-butyl methacrylate) [among them, one having a ratio of p-hydroxystyrene units to the sum of styrene units and tert-butyl methacrylate units of 7↑:3↓ is preferable], etc.

The polymer having an acid labile group and the polymer soluble in an aqueous alkaline developing solution of the present invention can be obtained by a radical polymerization with the use of an organic peroxide, an azo type compound, etc. as a polymerization initiator and a living polymerization with the use of n-butyl lithium, sec-butyl lithium, etc., followed by sujecting the resulting polymer to a chemical reaction upon necessity. More specifically, they can easily be obtained by the method disclosed in Japanese Patent Publication-Kokoku-No. 36602/1988, Japanese Patent Publication-Kokai-No. 211258/1992, 249682/1993, 123032/1996, 53621/1998, 207066/1998, etc.

A molecular weight and a dispersity (a ratio of a weight average molecular weight to a number averate molecular weight, Mw/Mn) of the polymer having an acid labile group and the polymer soluble in an aqueous alkaline developing solution of the present invention are 1,000 to 50,000, preferably 2,000 to 30,000 and 1.0 to 3.0, preferably 1.0 to 2.0, respectively by GPC measurement method using polystyrene as a standard.

The compound which becomes soluble in an aqueous alkaline developing solution by a chemical change by an action of an acid (hereinafter, abbreviated as a dissolving inhibitor agent having an acid labile group) used in the resist composition-2 of the present invention includes an alkaline insoluble compound in which a part or all of phenolic hydroxy groups in an alkaline soluble compound having phenolic hydroxy groups are protected by a tert-butoxycarbonyl group, a tert-butyl group, an 1-methoxyethyl group, an 1-ethoxyethyl group, a tetrahydropyranyl group, an 1-methylcyclohexyloxycarbonylmethyl group, etc.

More specifically, the compound includes one shown by the following general formula [16] or [17]

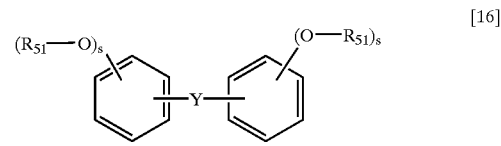

[16]

-continued

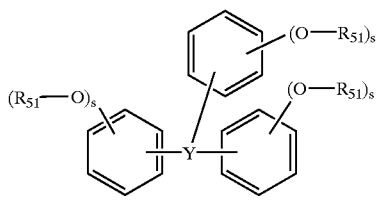

[17]

wherein $R_{51}$ is an alkyl group, an alkoxycarbonyl group, an alkoxyalkyl group, a tetrahydrofuranyl group or a tetrahydropyranyl group, s is 1 to 3, Y is a divalent or trivalent aliphatic hydrocarbon residue which may have a substituent, $(R_{51}\text{—O})s$ means that s numbers (in which s is 2 or 3) of the group $(R_{51}\text{—O})$ are substituted at the benzene ring, and a carbon atom in the hydrocarbon residue of Y and a carbon atom in the group shown $R_{51}$ may form together an aliphatic ring such as tetrahydropyranyloxy substituted by a lower alkyl group, including 1,1,3-trimethyl tetrahydropyranyloxy group. The alkyl group and the alkyl group in alkoxyalkyl group include one having 1 to 6 carbon atoms, such as a methyl group, an ethyl group, an n-propyl group, an isopropylgroup, an n-butyl group, an iso-butyl group, a tert-butyl group, an n-pentyl group, an isopentyl group, an n-hexyl group, an iso-hexyl group. The alkoxy group in the alkoxycarbonyl group and the alkoxyalkyl group include one having 1 to 6 carbon atoms, such as a methoxy group, an ethoxy group, an n-propoxy group, an iso-propoxy group, an n-butoxy group, an iso-butoxy group, a tert-butoxy group, an n-pentoxy group, an iso-pentoxy group, an n-hexyloxy group and an iso-hexyloxy group. The aliphatic hydrocarbon residue shown by Y includes a straight chained, branched or cyclic alkylene group having 1 to 6 carbon atoms such as a methylene group, an ethylene group, a methylmethylene group, a propylene group, an 1-methylethylene group, an 1,1-dimethylmethylene group, a butylene group, a hexylene group; a straight chained, branched or cyclic alkane triyl group having 2 to 6 carbon atoms an ethane triyl group, a propane triyl group, an 1-methylethane triyl group, an 1,1-dimethylmethane triyl group, a butane triyl group, a hexane triyl group. The substituent in Y includes an alkoxy group, an alkoxycarbonyl group and an aryl group which may have a substituent. The alkoxy group and the alkoxy group in the alkoxycarbonyl group includes one having 1 to 6 carbon atoms, such as a methoxy group, an ethoxy group, an n-propoxy group, an iso-propoxy group, an n-butoxy group, an iso-butoxy group, a tert-butoxy group, an n-pentoxy group. The aryl group includes a phenyl group, a naphtyl group etc. The substituent of the aryl group includes an aralkyl group, which may have a substituent such as a straight chaned, brancherd or cyclic alkyl group having 1 to 6 carbon atoms and an straight chained, branced or cyclic alkoxy group having 1 to 6 carbon atoms, such as a benzyl group, a phenethyl group, a phenylpropyl group, a methylbenzyl group, a methylphenetyl group, an ethylbenzyl group, and a dimethyl phenyl methyl group, etc.

The specific examples of the compound includes 2,2-bis (4-tert-butoxycarbonyloxyphenyl)propane, 2,2-bis(4-tert-butoxyphenyl)propane, 2,2-bis(4-tetrahydropyranyloxyphenyl)propane, 2,2-bis[4-(1-ethoxyethoxyphenyl)]propane, 2,2-bis(4-tert butoxycarbonyloxyphenyl)butane, 2,2-bis(4-tert-butoxyphenyl)butane, 2,2-bis(4-tetrahydrofuranyloxyphenyl)butane, 2,2-bis[4-(1-ethoxyethoxyphenyl)]-4-methylpentane, 3,3-bis(4-tert-butoxycarbonylmethoxyphenyl)butane, 1,1,1-tris(4-tert-butoxycarbonyloxyphenyl)ethane, 1,1,1-tris(4-tetrahydropyranyloxyphenyl)ethane, α,α,α'-tris(4-tert-butoxycarbonyloxyphenyl)-1-ethyl-4-isopropylbenzene, α,α,α'-tris(4-tetrahydropyranyloxyphenyl)-1-ethyl-4-isopropylbenzene, 3,4-dihydro-4-[2,4-di-(1-ethoxyethoxy) phenyl]-7-(1 -ethoxyethoxy)-2,2,4-trimethyl-2H-benzo-1-pyran, 3,4-dihydro-4-(2,4-di-tetrahydropyranyloxyphenyl)-7-tetrahydropyranyloxy-2,2,4-trimethyl-2H-benzo-1-pyran, tert-butyl 2,2-bis(4-tert-butoxycarbonyloxyphenyl) pentanonate, etc.

Those compounds may be used alone or in combination of two or more thereof.

As the polymer which becomes soluble in an aqueous alkaline developing solution by a chemical change by an action of an acid used in the resist composition-2 of the present invention, the same polymer as the polymer having an acid labile group used in the resist composition-1 mentioned above can be used.

The cross-linking compound which can make a polymer hardly soluble in an aqueous alkaline developing solution by a chemical change by an action of an acid, which is used the resist composition-3 of the present invention includes a compound shown by the following general formula [4];

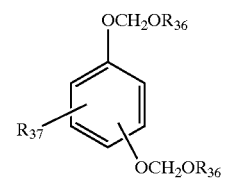

[4]

wherein $R_{36}$ is an alkyl group, $R_{37}$ is a hydrogen atom or a group shown by the general formula [5]:

[5]

wherein $R_{36}$ has the same meaning as above, or one shown by the general formula [6];

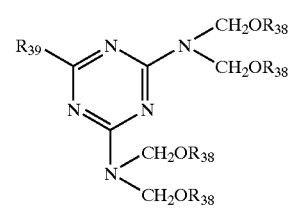

[6]

wherein $R_{38}$ is a hydrogen atom or an alkyl group, and $R_{39}$ is a hydrogen atom or a group shown by the general formula [7]:

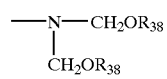

[7]

wherein $R_{38}$ has the same meaning as above.

The alkyl group shown by $R_{36}$ in the general formula [4] and [5] and one shown by $R_{38}$ in the general formula [6] and [7] may be straight chained, branched or cyclic and preferably one having 1 to 6 carbon atoms, which is specifically exemplified by a methyl group, an ethyl group, an n-propyl group, an isopropyl group, a cyclopropyl group, an n-butyl group, an isobutyl group, a tert-butyl group, a sec-butyl group, an n-pentyl group, an isopentyl group, a tert-pentyl group, a 1-methylpentyl group, a cyclopentyl group, an n-hexyl group, an isohexyl group, a cyclohexyl group, etc.

The cross-linking agent used in the resist composition-3 of the present invention includes specifically 2,4,6-tris (methoxymethyl)amino-1,3,5-s-triazine, 2,4,6-tris (ethoxymethyl)amino-1,3,5-s-triazine, tetramethoxymethylglycol urea, tetramethoxymethyl urea, 1,3,5-tris (methoxymethoxy)benzene, 1,3,5-tris(isopropoxymethoxy) benzene, α,α,α'-tris(isopropoxymethoxyphenyl)-1-ethyl-4-isopropylbenzene, α,α,α'-tris(methoxymethoxyphenyl)-1-ethyl-4-isopropylbenzene, CY-179 (Trade name of product manufactured and sold by Ciba-Geigy A.-G.), etc. Those compounds may be used alone or in combination of two or more thereof.

The compound generating an acid by actinic radiation, which is used in the resist compositions-1, 2 and 3 of the present invention (hereinafter, abbreviated as an acid generator) may be any one which can generate an acid by actinic radiation and gives no bad influence upon resist pattern formation, and includes preferably one which shows good transmittance around 248.4 nm and thus can keep high transparency of a resist material and one which can keep high transparency of a resist material in which transmittance around 248.4 nm is increased by exposure. Such particularly preferable acid generator as above includes compound shown by the general formula [8], [9], [11], [12], [13] and [15];

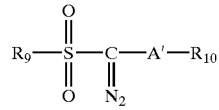
[8]

wherein $R_9$ and $R_{10}$ are independantly an alkyl group or a haloalkyl group and A' is a sulfonyl group or a carbonyl group;

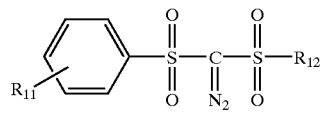
[9]

wherein $R_{11}$ is a hydrogen atom, an alkyl group, an alkoxy group or a haloalkyl group, and $R_{12}$ is an alkyl group, a haloalkyl group or a group shown by the following general formula [10]:

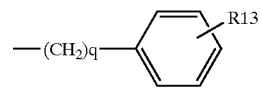
[10]

wherein $R_{13}$ is a hydrogen atom, a halogen atom, an alkyl group, an alkoxy group or a haloalkyl group, and q is 0 or an integer of 1 to 3;

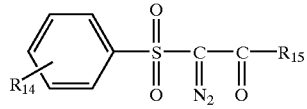
[11]

wherein $R_{14}$ is a hydrogen atom, a halogen atom, an alkyl group or a trifluoromethyl group and $R_{15}$ is an alkyl group, an aralkyl group, an alkoxy group, a phenyl group or a tolyl group;

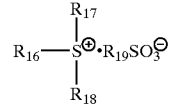
[12]

wherein $R_{16}$ is an alkyl group, a phenyl group, a substituted phenyl group or an aralkyl group, $R_{17}$ and $R_{18}$ are independently a hydrogen atom, an alkyl group, a phenyl group, a substituted phenyl group or an aralkyl group, and $R_{19}$ is a fluoroalkyl group, a trifluoromethylphenyl group, a methyl group or tolyl group;

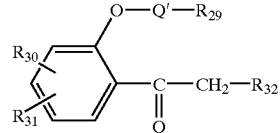
[13]

wherein $R_{29}$ is an alkyl group, a fluoroalkyl group, a phenyl group, a substituted phenyl group or an aralkyl group, Q' is a sulfonyl group or a carbonyl group, $R_{30}$ and $R_{31}$ are independently a hydrogen atom, a methyl group, a methoxy group, a nitro group, a cyano group, a hydroxy group or a group shown by the following general formula [14]:

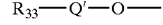
[14]

wherein $R_{33}$ is an alkyl group, a fluoroalkyl group, a phenyl group, a substituted phenyl group or an aralkyl group, Q' is a sulfonyl group or a carbonyl group, and $R_{32}$ is a hydrogen atom, a methyl group or an ethyl group;

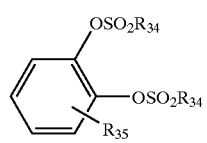
[15]

wherein $R_{34}$ is an alkyl group, a fluoroalkyl group, a phenyl group, a substituted phenyl group or an aralkyl group, $R_{35}$ is a hydrogen atom, a methyl group, a fluoroalkyl group, a methoxy group, a nitro group, a cyano group, a hydroxy group or a group shown by the above general formula [14].

The alkyl group or the alkyl group in the haloalkyl group shown by $R_9$ and $R_{10}$ in the general formula [8] may be straight chained, branched or cyclic, preferably one having 1 to 10 carbon atoms, which is specifically exemplified by a methyl group, an ethyl group, an n-propyl group, an isopropyl group, a cyclopropyl group, an n-butyl group, an isobutyl group, a tert-butyl group, a sec-butyl group, an n-pentyl group, an isopentyl group, a tert-pentyl group, an 1-methylpentyl group, a cyclopentyl group, an n-hexyl group, an isohexyl group, a cyclohexyl group, a heptyl group, an octyl group, a nonyl group, a decyl group, etc.

The halogen atm in the haloalkyl group includes chlorine, bromine, fluorine and iodine, etc.

The alkyl group or the alkyl group in the haloalkyl group shown by $R_{11}$ in the general formula [9] may be straight chained or branched, preferably one having 1 to 5 carbon atoms, which is specifically exemplified by a methyl group, an ethyl group, an n-propyl group, an isopropyl group, an n-butyl group, an isobutyl group, a tert-butyl group, a sec-butyl group, an n-pentyl group, an isopentyl group, a tert-pentyl group, a 1-methylpentyl group, etc; the halogen atom or halogen atm in the haloalkyl group shown by $R_{11}$ includes chlorine, bromine, fluorine and iodine. The alkoxy group shown by $R_{11}$ may be straight chained or branched, preferably one having 1 to 5 carbon atoms, which is specifically exemplified by a methoxy group, an ethoxy group, an n-propoxy group, an isopropoxy group, an n-butoxy group, an isobutoxy group, a tert-butoxy group, a sec-butoxy group, an n-pentyloxy group, an isopentyloxy group, etc. The alkyl group or the alkyl group in the haloalkyl group shown by $R_{12}$ may be straight chained, branched or cyclic one, preferably one having 1 to 10 carbon atoms, which is specifically exemplified by a methyl group, an ethyl group, an n-propyl group, an isopropyl group, a cyclopropyl group, an n-butyl group, an isobutyl group, a tert-butyl group, a sec-butyl group, an n-pentyl group,an isopentyl group, a tert-pentyl group, a 1-methylpentyl group, a cyclopentyl group, an n-hexyl group, an isohexyl group, a cyclohexyl group, a heptyl group, an octyl group, a nonyl group, a decyl group, etc; the halogen atm in the haloalkyl group includes chlorine, bromine, fluorine and iodine.

The alkyl group or the alkyl group in the haloalkyl group shown by $R_{13}$ in the general formula [10] may be straight chained or branched one and preferably one having 1 to 6 carbon atoms, which is specifically exemplified by a methyl group, an ethyl group, an n-propyl group, an isopropyl group, an n-butyl group, an isobutyl group, a tert-butyl group, a sec-butyl group, an n-pentyl group, an isopentyl group, a tert-pentyl group, a 1-methylpentyl group, an n-hexyl group, an isohexyl group, etc. The alkoxy group shown by $R_{13}$ having 1 to 6 carbon atoms may be straight chained or branched, preferably one having 1 to 5 carbon atoms, which is specifically exemplified by a methoxy group, an ethoxy group, an n-propoxy group, an isopropoxy group, an n-butoxy group, an isobutoxy group, a tert-butoxy group, a sec-butoxy group, an n-pentyloxy group, an isopentyloxy group, an hexyloxy group, an isohexyloxy group, etc., and the halogen atom or halogen atom in the haloalkyl group shown by $R_{13}$ includes chlorine, bromine, fluorine and iodine.

The alkyl group or the alkyl group in the haloalkyl group shown by $R_{14}$ in the general formula [11] may be straight chained or branched and preferably one having 1 to 5 carbon atoms, which is specifically exemplified by a methyl group, an ethyl group, an n-propyl group, an isopropyl group, an n-butyl group, an isobutyl group, a tert-butyl group, a sec-butyl group, an n-pentyl group, an isopentyl group, a tert-pentyl group, a 1-methylpentyl group, etc. The halogen atom shown by $R_{14}$ includes chlorine, bromine, fluorine and iodine. The alkyl group shown by $R_{15}$ may be straight chained, branched or cyclic and preferably one having 1 to 10 carbon atoms, which is specifically exemplified by a methyl group, an ethyl group, an n-propyl group, an isopropyl group, a cyclopropyl group, an n-butyl group, an isobutyl group, a tert-butyl group, a sec-butyl group, an n-pentyl group, an isopentyl group, a tert-pentyl group, a 1-methylpentyl group, a cyclopentyl group, an n-hexyl group, an isohexyl group, a cyclohexyl group, a heptyl group, an octyl group, a nonyl group, a decyl group, etc.

The aralkyl group shown by $R_{15}$ includes a benzyl group, a phenethyl group, a phenylpropyl group, a methylbenzyl group, a methylphenethyl group, an ethylbenzyl group, etc. The alkoxy group shown by $R_{15}$ may be straight chained or branched and is exemplified by one having 1 to 6 carbon atoms such as a methoxy group, an ethoxy group, an n-propoxy group, an isopropoxy group, an n-butoxy group, an isobutoxy group, a tert-butoxy group, a sec-butoxy group, an n-pentyloxy group, an isopentyloxy group, an n-hexyloxy group and an isohexyloxy group.

The alkyl group shown by $R_{16}$, $R_{17}$ and $R_{18}$ in the general formula [12] may be straight chained, branched or cyclic and preferably one having 1 to 8 carbon atoms, which is specifically exemplified by a methyl group, an ethyl group, an n-propyl group, an isopropyl group, a cyclopropyl group, an n-butyl group, an isobutyl group, a tert-butyl group, a sec-butyl group, an n-pentyl group, an isopentyl group, a tert-pentyl group, a 1-methylpentyl group, a cyclopentyl group, an n-hexyl group, an isohexyl group, a cyclohexyl group, a heptyl group, an octyl group, etc., and the substituted phenyl group includes a tolyl group, an ethylphenyl group, a tert-butylphenyl group, a chlorophenyl group, etc. The aralkyl group includes a benzyl group, a phenethyl group, a phenylpropyl group, a methylbenzyl group, a methylphenethyl group, an ethylbenzyl group, etc. The alkyl of the fluoroalkyl group shown by $R_{19}$ may be straight chained or branched, preferably one having 1 to 8 carbon atoms, which is specifically exemplified by a methyl group, an ethyl group, an n-propyl group, an isopropyl group, an n-butyl group, an isobutyl group, a tert-butyl group, a sec-butyl group, an n-pentyl group, an isopentyl group, a tert-pentyl group, a 1-methylpentyl group, an n-hexyl group, an isohexyl group, a heptyl group, an octyl group, etc., and the total number of the fluorine atoms substituted is preferably 1 to 17.

The alkyl group shown by $R_{29}$ in the general formula [13] may be straight chained, branched or cyclic and preferably one having 1 to 6 carbon atoms, which is specifically exemplified by a methyl group, an ethyl group, an n-propyl group, an isopropyl group, an n-butyl group, an isobutyl group, a tert-butyl group, a sec-butyl group, an n-pentyl group,an isopentyl group, a cyclopentyl group, an n-hexyl group, a cyclohexyl group, etc., the substituted phenyl group includes a tolyl group, an ethylphenyl group, a tert-butylphenyl group, a chlorophenyl group, etc., and the aralkyl group includes a benzyl group, a phenethyl group, a phenylpropyl group, a methylbenzyl group, a methylphenethyl group, an ethylbenzyl group, etc. The alkyl group in the fluoroalkyl group may be straight chained or branched and preferably one having 1 to 8 carbon atoms, which is specifically exemplified by a methyl group, an ethyl group, an n-propyl group, an isopropyl group, an n-butyl group, an isobutyl group, a tert-butyl group, a sec-butyl group, an n-pentyl group, an isopentyl group, an n-hexyl group, a heptyl group, an octyl group, etc. The total number of the fluorine atoms substituted is preferably 1 to 17.

The alkyl group shown by $R_{33}$ in the general formula [14] may be straight chained, branched or cyclic and preferably one having 1 to 6 carbon atoms, which is specifically exemplified by a methyl group, an ethyl group, an n-propyl group, an isopropyl group, an n-butyl group, an isobutyl group, a tert-butyl group, a sec-butyl group, an n-pentyl group, an isopentyl group, a cyclopentyl group, an n-hexyl group, a cyclohexyl group, etc., the substituted phenyl group includes a tolyl group, an ethylphenyl group, a tert-butylphenyl group, a chlorophenyl group, etc., and the aralkyl group includes a benzyl group, a phenethyl group, a phenylpropyl group, a methylbenzyl group, a methylphenethyl group, an ethylbenzyl group, etc. The alkyl group in the fluoroalkyl group may be straight chained or branched and preferably one having 1 to 8 carbon atoms, which is specifically exemplified by a methyl group, an ethyl group, an n-propyl group, an isopropyl group, an n-butyl group, an isobutyl group, a tert-butyl group, a sec-butyl group, an n-pentyl group, an isopentyl group, an n-hexyl-group, a heptyl group, an octyl group, etc. The total number of the fluorine atoms substituted is preferably 1 to 17.

The alkyl group shown by $R_{34}$ in the general formula [15] may be straight chained, branched or cyclic and preferably one having 1 to 6 carbon atoms, which is specifically exemplified by a methyl group, an ethyl group, an n-propyl group, an isopropyl group, an n-butyl group, an isobutyl group, a tert-butyl group, a sec-butyl group, an n-pentyl group, an isopentyl group, a cyclopentyl group, an n-hexyl group, a cyclohexyl group, etc., the substituted phenyl group includes a tolyl group, an ethylphenyl group, a tert-butylphenyl group, a chlorophenyl group, etc., and the aralkyl group includes a benzyl group, a phenethyl group, a phenylpropyl group, a methylbenzyl group, a methylphenethyl group, an ethylbenzyl group, etc. The alkyl group in the fluoroalkyl group shown by $R_{34}$ and $R_{35}$ may be straight chained or branched and preferably one having 1 to 8 carbon atoms, which is specifically exemplified by a methyl group, an ethyl group, an n-propyl group, an isopropyl group, an n-butyl group, an isobutyl group, a tert-butyl group, a sec-butyl group, an n-pentyl group, an isopentyl group, an n-hexyl group, a heptyl group, an octyl group, etc. The total number of the fluorine atoms substituted is preferably 1 to 17.

As specific preferable examples of the acid generators used in the present invention, one shown by the general formula [8] includes 1-cyclohexylsulfonyl-1-(1,1-dimethylethylsulfonyl)diazomethane, bis(1,1-dimethylethylsulfonyl)diazomethane, bis(1-methylethylsulfonyl)diazomethane, bis(cyclohexylsulfonyl)diazomethane, 1-cyclohexylsulfonyl-1-cyclohexylcarbonyl diazomethane, 1-diazo-1-cyclohexylsulfonyl-3,3-dimethylbutane-2-on, 1-diazo-1-methylsulfonyl-4-phenylbutane-2-on, 1-diazo-1-(1,1-dimethylethylsulfonyl)-3,3-dimethyl-2-butanone, 1-acetyl-1-(1-methylethylsulfonyl)diazomethane, etc.

The acid generator shown by the general formula [9] includes bis(p-toluenesulfonyl)diazomethane, bis(2,4-dimethylbenzenesulfonyl)diazomethane, methylsulfonyl-p-toluenesulfonyl diazomethane, bis(p-tert-butylphenylsulfonyl)diazomethane, bis(p-chlorobenzenesulfonyl)diazomethane, cyclohexylsulfonyl-p-toluenesulfonyl diazomethane, etc.

The acid generator shown by the general formula [11] includes 1-p-toluenesulfonyl-1-cyclohexycarbonyl diazomethane, 1-diazo-1-(p-toluenesulfonyl)-3,3-dimethylbutane-2-on, 1-diazo-1-benzenesulfonyl-3,3-dimethylbutan-2-on, 1-diazo-1-(p-toluenesulfonyl)-3-methylbutane-2-on, etc.

The acid generator shown by the general formula [12] includes triphenylsulfonium/trifluoromethanesulfonate, triphenylsulfonium/perfluorobutanesulfonate, triphenylsulfonium/perfluorooctanesulfonate, triphenylsulfonium/p-toluenesulfonate, diphenyl-p-tolylsulfonium/perfluorooctanesulfonate, diphenyl-p-tolylsulfonium/trifluoromethanesulfonate, diphenyl-p-tolylsulfonium/p-toluenesulfonate, diphenyl-p-tolylsulfonium/perfluorobutanesulfonate, diphenyl-p-tert-butylphenylsulfonium/perfluorooctanesulfonate, diphenyl-p-tert-butylphenylsulfonium/p-toluenesulfonate, tris(p-tolyl)sulfonium/perfluorooctanesulfonate, tris(p-chlorophenyl)sulfonium/trifluoromethanesulfonate, tris(p-tolyl)sulfonium/trifluoromethanesulfonate, trimethylsulfonium/trifluoromethanesulfonate, dimethylphenylsulfonium/trifluoromethanesulfonate, dimethyl-p-tolylsulfonium/trifluoropethanesulfonate, dimethyl-p-tolylsulfonium/perfluorooctanesulfonate, etc.

The acid generator shown by the general formula [13] includes 2,6-di-trifluoromethanesulfonyloxyacetophenone, 2,6-di-trifluoromethanesulfonyloxypropiophenone, 2,3,4-tris-trifluoromethanesulfonyloxyacetophenone, 2,6-di-methanesuflonyloxyacetophenone, 2,6-di-methanesulfonyloxypropiophenone, 2,3,4-tris-methanesulfonyloxyacetophenone, 2-trifluoromethanesulfonyloxyacetophenone, 2-methanesulfonyloxyacetophenone, 2-n-butanesuflonyloxyacetophenone, 2,6-di-n-butanesulfonyloxyacetophenone, 2,3,4-tris-n-butanesulfonyloxyacetophenone, 2,6-di-perfuloropropanecarboxyacetophenone, 2,3,4-tris-perfluoropropanecarboxyacetophenone, 2,6-di-p-toluenesuflonylacetophenone, 2,6-di-p-toluenesulfonylpropiophenone, 2,6-di-trifluoroacetyloxyacetophenone, 2-trifluoroacetyloxy-6-methoxyacetophenone, 6-hydroxy-2-perfluorobutanesulfonyloxyacetophenone, 2-trifluoroacetyloxy-6-nitroacetophenone, 2,3,4-tris-trifluoroacetyloxyacetophenone, 2,6-di-perfluoropropanoyloxyacetophenone, etc.

The acid generator shown by the general formula [15] includes 1,2,3-tris-methanesulfonyloxybenzene, 1,2,3-tris-p-toluenesulfonyloxybenzene, 1,2,3-tris-trifluoromethanesulfonyloxybenzene, 1,2,3-tris-perfluorobutanesulfonyloxybenzene, 1,2,3-tris-cyclohexylsulfonyloxybenzene, 1,2-di-methanesulfonyloxy-3-nitrobenzene, 2,3-di-methanesulfonyloxyphenol, 1,2,4-tris-p-toluenesulfonyloxybenzene, 1,2,4-tris-methanesulfonyoxybenzene, 1,2,4-tris-trifluoromethanesulfonyloxybenzene, 1,2,4-tris-cyclohexylsulfonyloxybenzene, 1,2-di-n-butanesulfonyloxy-3-nitrobenzene, 1,2,3-tris-perfluorooctanesulfonyloxybenzene, 1,2-di-perfluorobutanesulfonyloxyphenol, etc.

The acid generator of the present invention can easily be obtained by methods disclosed in Japanese Patent Publication-Kokai-Nos. 210960/1992, 211258/1992, 249682/1993, etc.

Those acid generator may be used alone or in combinations of two or more thereof.

The solvent used in the present invention may be any one which can dissolve the above mentioned compound, the polymer, the cross-linking agent, the acid generator and a basic compound, a surfactant, an UV absorber, dissolving accelerator, etc. which may be used upon necessity, and use is generally made of those showing good film-formation ability, such as methyl cellosolve acetate, ethyl cellosolve acetate, propyleneglycol monomethylether acetate, propyleneglycol monoethylether acetate, 2-heptanone, methyl 3-methoxy propionate, cyclohexanone, butyl acetate, diethyleneglycol dimethylether, etc.

An amount of the polymer having an acid labile group in the resist composition-1 of the present invention and the polymer soluble in an aqueous alkaline developing solution in the resist compositions-2 or -3 of the present invention which are occupied in the resist composition depend upon the thickness of the final resist film to be attained and are each generally 5 to 25 wt %, preferably 10 to 20 wt %.

An amount of the dissolving inhibitor having an acid labile group and/or the polymer having an acid labile group in the resist composition-2 of the present invention is 1 to 50 wt %, preferably 1 to 25 wt %, relative to the polymer soluble in an aqueous alkaline developing solution.

An amount of the cross-linking agent in the resist composition-3 of the present invention is 3 to 20 wt %, preferably 5 to 15 wt %, relative to the polymer soluble in an aqueous alkaline developing solution.

An amount of the acid generator of the present invention to be used is 0.1 to 20 wt %, preferably 0.5 to 15 wt %, relative to the polymer having an acid labile group in the resist composition-1 of the present invention and relative to the polymer soluble in an aqueous alkaline developing solution in the resist compositions-2 and -3 of the present invention, respectively.

An amount of the solvent of the present invention to be used is 50 to 95 wt %, preferably 60 to 90 wt %, relative to the total amount of the resist composition.

In the resist compositions of the present invention, use can be made of a basic compound, a surfactant, an UV absorber, a dissolving accelerator, etc., upon necessity, in addition to the above mentioned main ingredients.

The basic compound to be used in the resist compositions of the present invention upon necessity includes pyridine, picoline, triethylamine, tri-n-butylamine, tri-n-octylamine, dioctylmethylamine, dicyclohexylmethylamine, dimethyldodecylamine, dimethylhxadecylamine, N-methylpyrrolidine, N-methylpiperidine, triethanolamine, tris[2-(2-methoxyethoxy)ethyl]amine, tetramethylammonium hydroxide, tetrabutylammonium hydroxide, polyvinylpyridine, etc. They may be used alone or in combination of two or more thereof.

An amount of the basic compound of the present invention to be used is 0.05 to 1.0 wt %, preferably 0.1 to 0.5 wt %, relative to the total amount of the resist composition.

The surfactant to be used upon necessity in the resist compositions of the present invention includes a nonionic one (e.g. polyethylene glycol distearate, polyethylene glycol dilaurate, poly(ethylene glycol), poly(propylene glycol), polyoxyethylene cetyl ether), an anionic surfactant, a cationic surfactant, a fluorine-containing anionic surfactant, a fluorine-containing cationic surfactant, a fluorine-containing nonionic surfactant [e.g. Fluorad (a trade name of Sumitomo 3M, Ltd.), Surflon (a trade name of Asahi Glass Co., Ltd.), Unidyne (a trade name of Daikin Industries, Ltd.), Megafac (a trade name of Dainippon Ink & Chemicals, Inc.) and Eftop (a trade name of Tohkem Products Corp.)], etc. They may be used alone or in combination of two or more thereof.

An amount of the surfactant to be used may be selected from a range which has been generally used in this kind of technical field.

The UV absorber used upon necessity in the resist composition of the present invention includes 9-diazofluorenone, 9-(2-methoxyethoxymethyl) anthracene, 9-(2-ethoxyethoxymethyl)anthracene, 9-fluorenone, 2-hydroxycarbazole, o-naththoquinone diazide derivative, 4-diazo-1,7-diphenylpentane-3,5-dione, etc. They may be used alone or in combination of two or more thereof.

An amount of the UV-absorber to be used in the present invention may be selected from a range which has been generally used in this kind of technical field.

The dissolving accelerator to be used upon necessity in the resist composition of the present invention includes N,N-dimethylformamide, N,N-dimethylacetamide, γ-butyrolactone, etc. They may be used alone or in combination of two or more thereof.

An amount of the dissolving accelerator to be used in the present invention may be selected from a range which has been used generally in this kind of technical field.

As the aqueous alkaline developing solution of the present invention, use is made of 0.5 to 5 wt % diluted aqueous solution of tetramethylammonium hydroxide, choline, potassium hydroxide, sodium hydroxide, etc. There may be incorporated a surfactant and alcoholic compound in the aqueous alkaline developing solution in order to increase an affinity to the resist composition.

The pattern formation using the chemically-amplified resist composition of the present invention can be conducted as follows.

The resist composition of the present invention is spin-coated on a semiconductor substrate plate such as $SiO_2$ (oxide film), polysilicon, SiN, SiON, TiN, basic organic anti-reflective film, etc., and baked on a hot plate at 50 to 120° C. for 0.5 to 2 minutes to obtain a resist film of 0.3 to 2 $\mu$m thick. Then radiation (e.g. 248.4 nm KrF excimer laser, 300 nm or less deep UV, electron beam, soft X-ray, etc.) is irradiated selectively on the surface through a mask, and then if necessary baked (post baked) on a hot plate at 50 to 150° C. for 0.5 to 2 minutes, followed by developing with the use of an aqueous alkaline developing solution by a puddle method, a dip method, a spray method, etc., whereby the desired positive tone or negative tone pattern is formed due to a difference in solubility in the developing solution between the expose portion and the non-exposed portion.

The reason why the substrate dependency, the problem in a chemically-amplified resist, can be reduced by addition of the compound shown by the general formula [1] of the present invention, is considered, though not clearly explained, as follows in a case where the polymer having an acid labile group and/or the dissolution inhibitor having an acid labile group are used. Namely, for instance, in a case where the resist composition-1 of the present invention (containing the polymer having an acid labile group) containing the compound shown by the general formula [1] is coated on a substrate and pre-baked to form a resist film, there occurs such a reaction as a part of the acid labile group of the polymer having an acid labile group being removed by an alcoholic hydroxy group of the compound shown by the general formula [1] (see the following equation 1).

This reaction occurs regardless of whether the acid generated by the acid generator by an actinic radiation is deactivated by a basic substance or water generated from the specific substrate such as SiN, TiN, SiN, BPSG, a basic organic anti-reflective film, etc., and is accelerated by heating, and therefore, there is found such characteristics that this reaction occurs much remarkably around the substrate. Thus, it is considered that when a resist film is formed and then as pattern is formed with the use of the resist composition containing the compound shown by the formula [1] of the present invention after the usual manner, the resist around the substrate becomes eaily soluble in an aqueous alkaline developing solution regardless of whether the acid generated by the actinic radiation is deactivated or not and consequently the problem of substrate dependence can completely be solved.

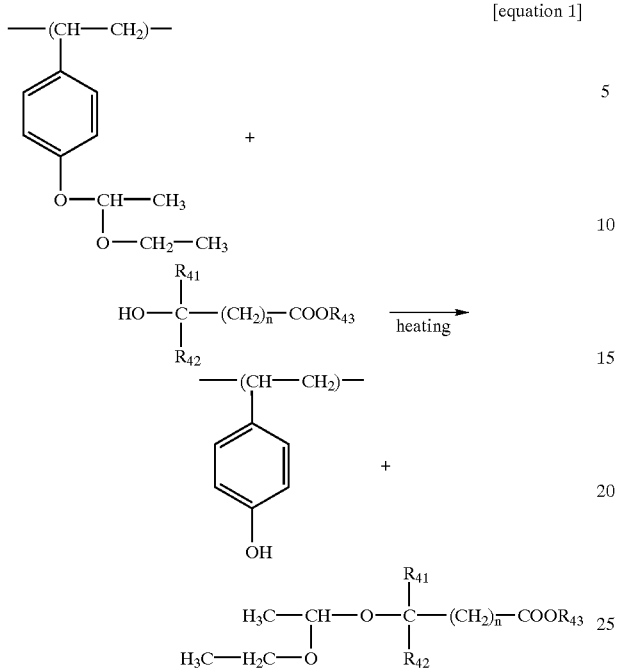

[equation 1]

(in case where the acid labile group is 1-ethoxyethyl group).

The present invention is concerned an invention which can solve completely footing, etc., observed in using a positive tone resist, which is caused by deactivation of an acid generated by an actinic radiation around the surface area of a substrate in case of using so-far known chemically-amplified resist composition to a specific substrate, particularly to a basic substrate (e.g. SiN, TiN, SiON, a basic organic anti-reflective film, etc.). Further, the present invention can solve completely the problem of substrate dependence essentially common to all chemically-amplified resist compositions, and thus the present invention can be used to a chemically-amplified resist composition not only for KrF excimer laser but also for ArF excimer laser, electron beam and others (regardless of positive tone or negative tone).

In the following, the present invention is explained in details referring to Examples and Comparative examples, and the present invention is not limited thereto by any means.

A part of the polymers and the acid generators used in the Examples and Control examples were synthesized according to the methods disclosed Japanese Patent Publication-Kokai-Nos 211258/1992, 210960/1992, 249682/1993; 194472/1993, 53621/1998, etc.

EXAMPLE 1

A resist composition having the following ingredients was prepared:

| | |
|---|---|
| poly(p-1-ethoxyethoxystyrene/ p-tert-butoxystyrene/p-hydroxystyrene) [constitutional ratio = 30:10:60, Mw 20000, Mw/Mn = 1.85] | 4.5 g |
| bis(cyclohexylsulfonyl)diazomethane | 0.3 g |
| bis(p-toluenesulfonyl)diazomethane | 0.15 g |
| tri-n-butylamine | 0.05 g |
| ethyl lactate | 3.0 g |
| propyleneglycol monomethylether acetate | 22.0 g |

The above mixed solution was filtrated through a filter of 0.2 μm to give a resist composition, and a pattern was formed as follows.

The above resist composition was spin-coated on a silicon substrate surface, followed by pre-baking at 90° C. for 90 seconds on a hot plate to give a resist film of 0.7 μm thick. Then, the resist film was selectively exposed to KrF excimer laser (λ=248.4 nm, NA 0.55) through a mask, followed by post-baking at 105° C. for 90 seconds on a hot plate. The resultant was developed by a paddle method with an aqueous alkaline developing solution (a 2.38% aqueous solution of tetramethylammonium hydroxide) to dissolve 0.20 μm line and space (hereinafter, abbreviated as L & S) pattern having a rectangular shape without footing at a dose of 32 mJ/cm$^2$. There was found no peeling off upon development. A coating homogeneity was good such as deviation of film thickness on the whole surface of wafer upon film formation being ±10 Å. Further, when the same pattern formation as above was conducted by using the same composition after storage at 23° C. for 3 months, a 0.20 μm L & S pattern having a rectangular shape without footing was obtained at a dose of 32 mJ/cm$^2$.

EXAMPLE 2

A spin-coating was conducted on a SiN substrate surface with the use of the same resist composition as in Example 1 so as to conduct a pattern formation, whereupon 0.20 μm L & S pattern having a rectangular shape without footing as illustrated in FIG. 1 was obtained at a dose of 44 mJ/cm$^2$. No peeling-off was observed.

EXAMPLE 3

A spin coating was conducted on a TiN substrate surface with the use of the same resist composition as Example 1 after the same manner as in Example 1, whereupon 0.20 μm L & S pattern having a rectangular shape without footing as illustrated in FIG. 1 was obtained at a dose of 40 mJ/cm$^2$. No peeling-off was observed.

EXAMPLE 4

A spin coating was conducted on a SiON substrate surface with the use of the same resist composition as Example 1 after the same manner as in Example 1, whereupon 0.20 μm L & S pattern having a rectangular shape without footing as illustrated in FIG. 1 was obtained at a dose of 44 mJ/cm$^2$. No peeling-off was observed.

EXAMPLE 5

A spin coating was conducted on a BPSG substrate surface with the use of the same resist composition as Example 1 after the same manner as in Example 1, whereupon 0.20 μm L & S pattern having a rectangular shape without footing as illustrated in FIG. 1 was obtained at a dose of 33 mJ/cm$^2$. No peeling-off was observed.

EXAMPLES 6 TO 8

Resist compositions in Table 1 were prepared.

TABLE 1

| E x m p | poly (p-1-ethoxyethoxystyrene/p-hydroxystyrene/ tert-butyl methacrylate) [constitutional ratio = 32:58:10, Mw 11000, Mw/Mn = 1.70] | 4.5 g |
|---|---|---|

TABLE 1-continued

| | | |
|---|---|---|
| 6 | bis(1,1-dimemthylethylsulfonyl)diazomethane | 0.3 g |
| | tetra-n-butylammonium hydroxide | 0.03 g |
| | methyl glycolate | 1.5 g |
| | propyleneglycol monomethylether acetate | 23.7 g |
| Ex p 7 | poly(p-1-ethoxyethoxystyrene/p-tert-butoxycarbonyloxystyrene/p-hydroxystyrene) [constitutional ratio = 30:62.8:8, Mw 10300, Mw/Mn = 1.05] | 4.5 g |
| | bis(cyclohexylsulfonyl)diazomethane | 0.3 g |
| | diphenyl-p-tolylsulfonium/p-toluenesulfonate | 0.1 g |
| | triethylamine | 0.05 g |
| | ethyl glycolate | 1.5 g |
| | propyleneglycol monomethylether acetate | 23.5 g |
| Ex p 8 | poly(p-tert-butoxystyrene/p-hydroxystyrene) [constitutional ratio = 15:85, Mw 13500, Mw/Mn = 1.40] | 4.0 g |
| | 3,4-dihydro-4-(2,4-ditetrahydropyranyloxy-phenyl)-7-tetrahydropyranyloxy-2,2,4-trimethyl-2H-benzo-1-pyrane | 1.0 g |
| | bis(1-methylethylsulfonyl)diazomethane | 0.3 g |
| | triphenylsulfonium/p-toluenesulfonate | 0.1 g |
| | tri-n-octylamine | 0.05 g |
| | ethyl 2-hydroxybutyrate | 3.0 g |
| | propyleneglycol monomethylether acetate | 20.7 g |

Pattern formation was conducted after the same manner as in Examples 1 to 4. The result is shown in Table 2.

TABLE 2

| | | silicon substrate | SiN substrate | TiN substrate | SiON substrate |
|---|---|---|---|---|---|
| Ex p 6 | dose dissolution form | 36 mJ/cm² 0.20 μm L & S rectangular no footing | 50 mJ/cm² 0.20 μm L & S rectangular no footing | 45 mJ/cm² 0.20 μm L & S rectangular no footing | 50 mJ/cm² 0.20 μm L & S rectangular no footing |
| Ex p 7 | dose dissolution form | 26 mJ/cm² 0.20 μm L & S rectangular no footing | 36 mJ/cm² 0.20 μm L & S rectangular no footing | 33 mJ/cm² 0.20 μm L & S rectangular no footing | 38 mJ/cm² 0.20 μm L & S rectangular no footing |
| Ex p 8 | dose dissolution form | 26 mJ/cm² 0.20 μm L & S rectangular no footing | 35 mJ/cm² 0.20 μm L & S rectangular no footing | 32 mJ/cm² 0.20 μm L & S rectangular no footing | 36 mJ/cm² 0.20 μm L & S rectangular no footing |

A coating homogeneity in case of film formation on a silicon substrate using the resist compositions of Examples 6 to 8 was good such as deviation of film thickness on the whole surface of wafer upon film formation being ±10 Å. Further, when the same pattern formation as above was conducted by using the same composition after storage at 23° C. for 3 months, there was found no change in sensitivity, dissolution and shape.

EXAMPLE 9

A resist composition having the following ingredients was prepared:

| | |
|---|---|
| poly(p-1-cyclohexyloxyethoxystyrene/p-tert-butoxycarbonyloxystyrene/p-hydroxystyrene) [constitutional ratio = 25:10:65, Mw 18700, Mw/Mn = 1.11] | 2.5 g |
| poly(p-1-ethoxyethoxystyrene/p-hydroxystyrene) [constitutional ratio = 36:64, Mw 17500, Mw/Mn = 1.15] | 2.0 g |
| bis(cyclohexylsulfonyl)diazomethane | 0.25 g |
| diphenyl-p-tolylsulfonium/p-toluenesulfonate | 0.1 g |
| dicyclohexylamine | 0.05 g |
| ethyl 3-hydroxybutyrate | 8.8 g |
| propyleneglycol monomethylether acetate | 16.3 g |

The above mixed solution was filtrated through a filter of 0.2 μm to give a resist composition and the above resist composition was spin-coated on a silicon substrate surface, followed by conducting a pattern formation after the same manner as in Example 1 to give 0.20 μm L & S pattern having a rectangular shape without footing at a dose of 28 mJ/cm². There was found no peeling off in the inner surface of a wafer upon development. A coating homogeneity was good such as deviation of film thickness in the inner surface of a wafer upon film formation being ±10 Å. Further, when the same pattern formation as above was conducted after the same manner as in Example 1 with the use of the composition after storage at 23° C. for 3 months, a 0.20 μm L & S pattern having a rectangular shape without footing was obtained at a dose of 28 mJ/cm².

EXAMPLE 10

A spin-coating was conducted on a TiN substrate surface with the use of the resist composition described in Example 9, followed by conducting a pattern formation after the same manner as in Example 1 to give 0.20 μm L & S pattern having a rectangular shape without footing at a dose of 35 mJ/cm². There was found no peeling-off.

EXAMPLE 11

A spin-coating was conducted on a SiON substrate surface with the use of the resist composition described in Example 9, followed by conducting a pattern formation after the same manner as in Example 1 to give 0.20 μm L & S pattern having a rectangular shape without footing at a dose of 39 mJ/cm². There was found no peeling-off.

EXAMPLE 12

An anti-reflective coating (DUV-32, manufactured by Brewer Science) was spin-coated on a silicon substrate surface, followed by heating at 200° C. for 60 seconds on a hot plate to give an anti-reflective film. A spin-coating was conducted on the surface of the anti-reflective film using the resist composition described in Example 9, followed by conducting a pattern formation after the same manner as in Example 1 to give 0.20 μm L & S pattern having a rectangular shape without footing at a dose of 32 mJ/cm². There was found no peeling-off.

EXAMPLE 13

A resist composition having the following ingredients was prepared:

| | |
|---|---|
| poly(p-1-ethoxyethoxystyrene/cyclohexyl acrylate/p-hydroxystyrene) [constitutional ratio = 30:10:60, Mw 17500, Mw/Mn = 1.65] | 4.0 g |
| poly (p-1-ethoxyethoxystyrene/p-hydroxystyrene) [constitutional ratio = 36:64, Mw 17500, Mw/Mn = 1.15] | 0.5 g |

| | |
|---|---|
| bis(1,1-dimethylethylsulfonyl)diazomethane | 0.25 g |
| diphenyl-p-tolylsulonium/p-toluenesulfonate | 0.1 g |
| tri-n-octylamine | 0.05 g |
| ethyl 3-hydroxybutyrate | 4.0 g |
| propyleneglycol monomethylether acetate | 21.0 g |

The above mixed solution was filtrated through a filter of 0.2 μm to give a resist composition, and the resist composition was spin-coated on a silicon substrate surface, followed by conducting a pattern formation by the same manner as in Example 1 to give 0.20 μm L & S pattern having a rectangular shape without footing at a dose of 30 mJ/cm$^2$. There was found no peeling off in the inner surface of a wafer upon development. A coating homogeneity was good such as deviation of film thickness in the inner surface of a wafer upon film formation being ±10 Å. Further, when the same pattern formation as above was conducted after the same manner as in Example 1 with the use of the composition after storage at 23° C. for 3 months, a 0.20 μm L & S pattern having a rectangular shape without footing was obtained at a dose of 30 mJ/cm$^2$.

EXAMPLE 14

A spin-coating was conducted on a TiN substrate surface with the use of the resist composition described in Example 13, followed by conducting a pattern formation after the same manner as in Example 1 to give a 0.20 μm L & S pattern having a rectangular shape without footing at a dose of 38 mJ/cm$^2$. There was found no peeling-off.

EXAMPLE 15

A spin-coating was conducted on a SiON substrate surface with the use of the resist composition described in Example 13, followed by conducting a pattern formation after the same manner as in Example 1 to give a 0.20 μm L & S pattern having a rectangular shape without footing at a dose of 43 mJ/cm$^2$. There was found no peeling-off.

EXAMPLE 16

A spin-coating was conducted on an anti-reflective film formed by a method of Example 12 with the use of the resist composition described in Example 13, followed by conducting a pattern formation after the same manner as in Example 1 to give 0.20 μm L & S pattern having a rectangular shape without footing at a dose of 34 mJ/cm$^2$. There was found no peeling-off.

EXAMPLE 17

A resist composition having the following ingredients was prepared

| | |
|---|---|
| poly(p-1-ethoxyethoxystyrene/p-hydroxystyrene) [constitutional ratio = 15:85, Mw 2600, Mw/Mn = 1.05] | 4.5 g |
| 2,4,6-tris-(methoxymethyl)amino-1,3,5-s-triazine | 1.3 g |
| bis(cyclohexylsulfonyl)diazomethane | 0.25 g |
| diphenyl-p-tolylsulonium/perfluorooctanesulfonate | 0.1 g |
| tri-n-octylamine | 0.05 g |
| ethyl 3-hydroxybutyrate | 5.0 g |
| propyleneglycol monomethylether acetate | 20.5 g |

The above mixed solution was filtrated through a filter of 0.2 μm to give a resist composition, and the resist composition was spin-coated on a silicon substrate surface, followed by conducting a pattern formation by the same manner as in Example 1 to give 0.20 μm L & S negative pattern having a rectangular shape without under-cut at a dose of 24 mJ/cm$^2$. There was found no peeling off in the inner surface of a wafer upon development. A coating homogeneity was good such as deviation of film thickness in the inner surface of a wafer upon film formation being ±10 Å. Further, when the same pattern formation as above was conducted after the same manner as in Example 1 with the use of the composition after storage at 23° C. for 3 months, a 0.20 μm L & S pattern having a rectangular shape without footing was obtained at a dose of 24 mJ/cm$^2$.

EXAMPLE 18

A spin-coating was conducted on a SiON substrate surface with the use of the resist composition described in Example 17, followed by conducting a pattern formation after the same manner as in Example 1 to give a 0.20 μm L & S negative pattern having a rectangular shape without under-cut at a dose of 43 mJ/cm$^2$. There was found no peeling-off in the inner surface of wafer.

EXAMPLE 19

A resist composition having the following ingredients was prepared:

| | |
|---|---|
| poly(p-1-cyclohexyloxyethoxystyrene/ p-tert-butoxycarbonyloxystyrene/p-hydroxystyrene) [constitutional ratio = 25:10:65, Mw 18700, Mw/Mn = 1.11] | 2.5 g |
| poly(p-1-ethoxyethoxystyrene/p-hydroxystyrene) [constitutional ratio = 36:64, Mw 17500, Mw/Mn = 1.15] | 2.0 g |
| bis(1,1-dimethylethylsulfonyl)diazomethane | 0.25 g |
| diphenyl-p-tolylsulonium/p-toluenesulfonate | 0.1 g |
| dicyclohexylmethylamine | 0.05 g |
| ethyl 3-hydroxybutyrate | 1.5 g |
| ethyl lactate | 1.5 g |
| propyleneglycol monomethylether acetate | 22.1 g |

The above mixed solution was filtrated through a filter of 0.2 μm to give a resist composition, and the resist composition was spin-coated on a silicon substrate surface, followed by conducting a pattern formation by the same manner as in Example 1 to give 0.20 μm L & S negative pattern having a rectangular shape without footing at a dose of 30 mJ/cm$^2$. There was found no peeling off in the inner surface of a wafer upon development. A coating homogeneity was good such as deviation of film thickness on the inner surface of a wafer upon film formation being ±10 Å. Further, when the same pattern formation as above was conducted after the same manner as in Example 1 with the use of the composition after storage at 23° C. for 3 months, a 0.20 μm L & S pattern having a rectangular shape without footing was obtained at a dose of 30 mJ/cm$^2$.

EXAMPLE 20

A spin-coating was conducted on a TiN substrate surface with the use of the resist composition described in Example 19, followed by conducting a pattern formation after the same manner as in Example 1 to give a 0.20 μm L & S pattern having a rectangular shape without footing at a dose of 40 mJ/cm$^2$. There was found no peeling-off.

EXAMPLE 21

A spin-coating was conducted on a SiON substrate surface with the use of the resist composition described in Example 19, followed by conducting a pattern formation after the same manner as in Example 1 to give a 0.20 μm L & S pattern having a rectangular shape without footing at a dose of 44 mJ/cm². There was found no peeling-off.

EXAMPLE 22

A spin-coating was conducted on an anti-reflective film formed by a method of Example 12 with the use of the resist composition described in Example 19, followed by conducting a pattern formation after the same manner as in Example 1 to give 0.20 μm L & S pattern having a rectangular shape without footing at a dose of 36 mJ/cm². There was found no peeling-off.

Comparative Example 1

A resist composition having the following ingredients was prepared

| | |
|---|---|
| poly(p-1-ethoxyethoxystyrene/ p-tert-butoxystyrene/p-hydroxystyrene) [constitutional ratio = 30:10:60, Mw 20000, Mw/Mn = 1.85] | 4.5 g |
| bis(cyclohexylsulfonyl)diazomethane | 0.3 g |
| bis(p-toluenesulfonyl)diazomethane | 0.15 g |
| tri-n-butylamine | 0.05 g |
| propyleneglycol monomethylether acetate | 25.0 g |

Figure 2:
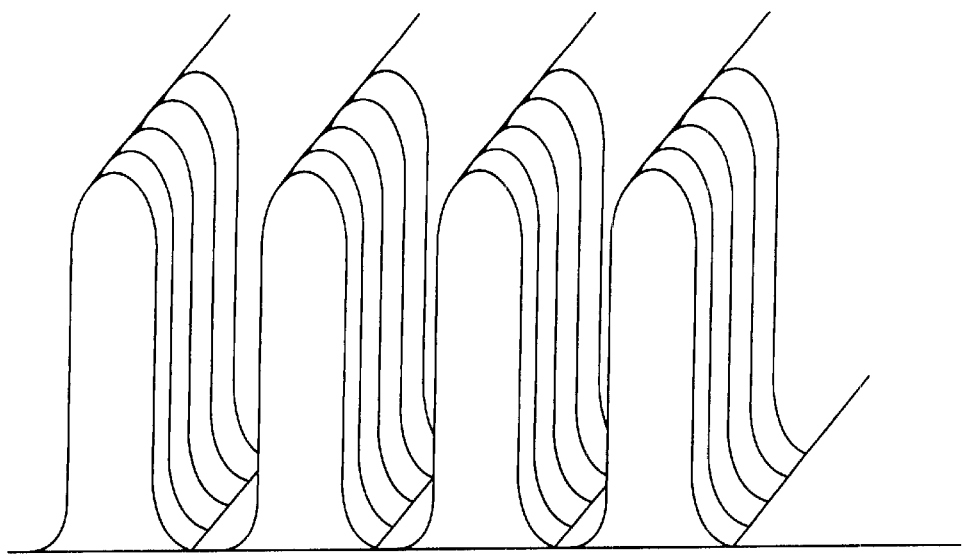
FIG. 2 shows a cross-section view of patterns on TiN substrate and SiON substrate in Comparative Example 1, on silicon substrate using resist composition after storage for 3 months in Comparative Example 2, and on TiN substrate in Comparative Examples 3 to 5, which are such bad ones as accompanied with a round shape on its upper part and footing.

With the use of the above resist composition, a pattern formation was conducted on a silicon substrate after the same manner as in Example 1 to dissolve 0.20 μm L & S pattern having a rectangular shape without footing at a dose of 35 mJ/cm². A coating homogeneity was good such as deviation of film thickness on the whole surface of wafer upon film formation being ±10 Å and there was observed no peeling-off. Then, with the use of the above resist composition, a pattern formation was conducted on a TiN substrate surface after the same manner as in Example 3, whereupon 0.20 μm L & S pattern was dissolved at a dose of 44 mJ/cm² but the pattern was, as shown in FIG. 2, such a bad one as being accompanied with a round shape on its upper part and large footing. Further, with the use of the above resist composition, a pattern formation was conducted on a SiON substrate surface after the same manner as in Example 4, whereupon 0.20 μm L & S pattern was dissolved at a dose of 50 mJ/cm² but the pattern was, as shown in FIG. 2, such a bad one as being accompanied with a round shape on its upper part and large footing.

Comparative Example 2

A resist composition having the following ingredients was prepared:

| | |
|---|---|
| poly(p-1-ethoxyethoxystyrene/ p-tert-butoxystyrene/p-hydroxystyrene) [constitutional ratio = 30:10:60, Mw 20000, Mw/Mn = 1.85] | 4.5 g |
| bis(cyclohexylsulfonyl)diazomethane | 0.3 g |
| bis(p-toluenesulfonyl)diazomethane | 0.15 g |
| tri-n-butylamine | 0.05 g |
| ethyl lactate | 25.0 g |

With the use of the above resist composition, a pattern formation was conducted on a silicon substrate after the same manner as in Example 1 to dissolve 0.20 μm L & S pattern having a rectangular shape without footing at a dose of 35 mJ/cm². But a coating homogeneity was large such as deviation of film thickness on the whole surface of wafer upon film formation being ±20 Å and there was observed peeling-off in the inner surface of a wafer.

Figure 3:
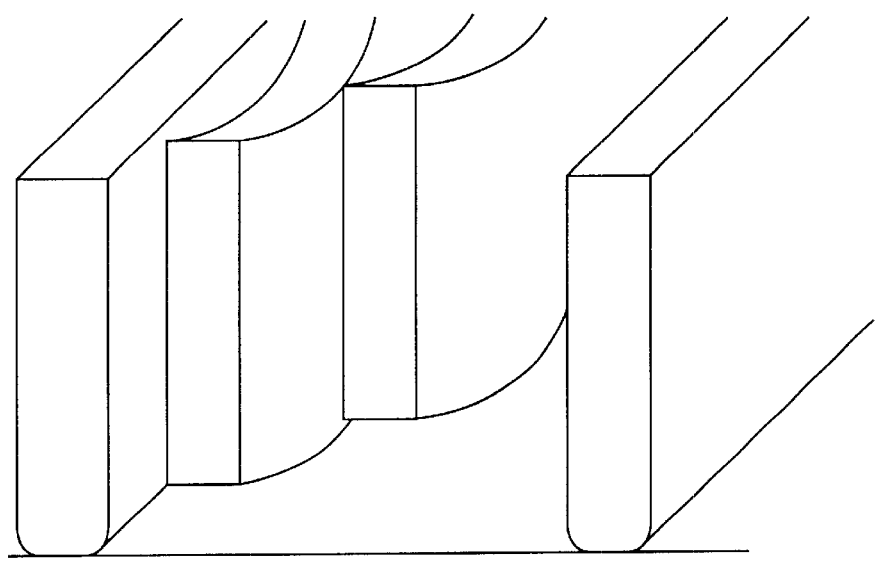
FIG. 3 shows a cross-section view of a bad pattern with peeling off on silicon substrate and TiN substrate in Comparative Example 2.

Further, with the use of the above resist composition, a pattern formation was conducted on a TiN substrate surface after the same manner as in Example 3, whereupon 0.20 μm L & S pattern was dissolved at a dose of 44 mJ/cm². The pattern obtained has a rectangular shape without footing, but there were observed many peeling-off in the inner surface of a wafer as shown in FIG. 3. Further, the above composition was stored at 23° C. for 3 months and a pattern was formed with the use of thus stored composition on a silicon substrate after the same manner as in Example 1, whereupon 0.22 μm L & S pattern was dissolved at a dose of 33 mJ/cm² but the pattern was such a bad one as being accompanied with a round shape on its upper part and footing.

Comparative Example 3

A resist composition having the following ingredients was prepared:

| | |
|---|---|
| poly(p-1-ethoxyethoxystyrene/ p-tert-butoxystyrene/p-hydroxystyrene) [constitutional ratio = 30:10:60, Mw 20000, Mw/Mn = 1.85] | 4.5 g |
| bis(cyclohexylsulfonyl)diazomethane | 0.3 g |
| bis(p-toluenesulfonyl)diazomethane | 0.15 g |
| tri-n-butylamine | 0.05 g |
| salicylic acid | 0.3 g |
| propyleneglycol monomethylether acetate | 25.0 g |

With the use of the above resist composition, a pattern formation was conducted on a TiN substrate after the same manner as in Example 3 to dissolve 0.20 μm L & S pattern at a dose of 38 mJ/cm², but the pattern was, as shown in FIG. 2, such a bad one as being accompanied with a round shape on its upper part and footing.

Comparative Example 4

A resist composition having the following ingredients was prepared

| | |
|---|---|
| poly(p-1-ethoxyethoxystyrene/ p-tert-butoxystyrene/p-hydroxystyrene) [constitutional ratio = 30:10:60, Mw 20000, Mw/Mn = 1.85] | 4.5 g |
| bis(cyclohexylsulfonyl)diazomethane | 0.3 g |
| bis(p-toluenesulfonyl)diazomethane | 0.15 g |
| tri-n-butylamine | 0.05 g |
| diphenolic acid | 0.3 g |
| propyleneglycol monomethylether acetate | 25.0 g |

With the use of the above resist composition, a pattern formation was conducted on a TiN substrate after the same manner as in Example 3 to dissolve 0.20 μm L & S pattern at a dose of 38 mJ/cm², but the pattern was, as shown in FIG. 2, such a bad one as being accompanied with a round shape on its upper part and footing.

Comparative Example 5

A resist composition having the following ingredients was prepared:

| | |
|---|---|
| poly(p-1-ethoxyethoxystyrene/<br>p-tert-butoxystyrene/p-hydroxystyrene)<br>[constitutional ratio = 30:10:60, Mw 20000,<br>Mw/Mn = 1.85] | 4.5 g |
| bis(cyclohexylsulfonyl)diazomethane | 0.3 g |
| bis(p-toluenesulfonyl)diazomethane | 0.15 g |
| tri-n-butylamine | 0.05 g |
| succinimide | 0.3 g |
| propyleneglycol monomethylether acetate | 25.0 g |

With the use of the above resist composition, a pattern formation was conducted on a TiN substrate after the same manner as in Example 3 to dissolve 0.20 μm L & S pattern at a dose of 38 mJ/cm², but the pattern was, as shown in FIG. 2, such a bad one as being accompanied with a round shape on its upper part and footing.

Comparative Example 6

A resist composition having the following ingredients was prepared:

| | |
|---|---|
| poly(p-1-ethoxyethoxystyrene/<br>p-tert-butoxystyrene/p-hydroxystyrene)<br>[constitutional ratio = 30:10:60, Mw 20000,<br>Mw/Mn = 1.85] | 4.5 g |
| bis(cyclohexylsulfonyl)diazomethane | 0.3 g |
| bis(p-toluenesulfonyl)diazomethane | 0.15 g |
| tri-n-butylamine | 0.05 g |
| ethyl lactate | 12.5 g |
| propyleneglycol monomethylether acetate | 12.5 g |

With the use of the above resist composition, a pattern formation was conducted on a silicon substrate after the same manner as in Example 1 to dissolve 0.20 μm L & S pattern having a rectangular shape without footing at a dose of 35 mJ/cm², but a coating homogeneity was large such as deviation of film thickness in the inner surface of a wafer upon film formation being ±20 Å and there was observed peeling-off in the inner surface of a wafer.

Further, with the use of the above resist composition, a pattern formation was conducted on a TiN substrate surface after the same manner as in Example 3, whereupon 0.20 μm L & S pattern was dissolved at a dose of 44 mJ/cm². The pattern obtained has a rectangular shape without footing, but there were observed many peeling-off in the inner surface of a wafer. Further, the above composition was stored at 23° C. for 3 months and a pattern was formed with the use of thus stored composition after the same manner as Example 1, whereupon 0.22 μm L & S pattern was dissolved at a dose of 33 mJ/cm² but the pattern was such a bad one as being accompanied with a round shape on its upper part and footing.

Comparative Example 7

A resist composition having the following ingredients was prepared:

| | |
|---|---|
| poly(p-1-ethoxyethoxystyrene/<br>p-tert-butoxystyrene/p-hydroxystyrene)<br>[constitutional ratio = 30:10:60, Mw 20000,<br>Mw/Mn = 1.85] | 4.5 g |
| bis(cyclohexylsulfonyl)diazomethane | 0.3 g |
| bis(p-toluenesulfonyl)diazomethane | 0.15 g |
| tri-n-butylamine | 0.05 g |
| ethyl lactate | 0.12 g |
| propyleneglycol monomethylether acetate | 24.9 g |

With the use of the above resist composition, a pattern formation was conducted on a silicon substrate after the same manner as in Example 1 to dissolve 0.20 μm L & S pattern having a rectangular shape without footing at a dose of 35 mJ/cm². A coating homogeneity was good such as deviation of film thickness in the inner surface of wafer upon film formation being ±10 Å and there was observed no peeling-off in the inner surface of a wafer.

Then, with the use of the above resist composition, a pattern formation was conducted on a TiN substrate surface after the same manner as in Example 3, whereupon 0.20 μm L & S pattern was dissolved at a dose of 44 mJ/cm²0.20 μm L & S pattern was dissolved at a dose of 44 mJ/cm², but the pattern was such a bad one as being accompanied with a round shape on its upper part and footing. Further, with the use of the above composition, a pattern formation was conducted on a SiON substrate a after the same manner as in Example 4, whereupon 0.22 μm L & S pattern was dissolved at a dose of 50 mJ/cm² but the pattern was such a bad one as being accompanied with a round shape on its upper part and footing. Still further, with the use of the above composition, a pattern formation was conducted on an anti-reflection membrane formed by a method in Example 12, whereupon 0.20 μm L & S pattern was dissolved at a dose of 38 mJ/cm² but the pattern was such a bad one as being accompanied with a round shape on its upper part and a large footing.

As clear from the above-mentioned, when the compound (an agent for reducing substrate dependence) shown by the general formula [1] of the present invention is added to a chemically-amplified resist composition, it is possible to solve completely such a problem concerning substrate dependence so far being encountered in a case of using known chemically-amplified resist compositions as a pattern becoming bad because of deactivation of an acid generated by an actinic radiation which is caused by the influence of a basic substance and water generated from various kinds of substrates, and therefore the desired pattern formation can be formed without any problem on every kinds of substrates.

The technology of the present invention can be satisfactorily applied to a chemically-amplified resist compositions not only for KrF excimer laser, but also for ArF excimer laser which is expected to be put into actual use in near future, for F2 excimer laser, electron beam, and other various kinds of chemically amplified resist compositions. Therefore, the present invention has high value for ultra-fine pattern formation in semiconductor industries.

What is claimed is:

1. A method for reducing substrate dependence of a resist composition, which comprises the steps of:

incorporating into the resist composition, as an agent for reducing substrate dependence, a compound shown by the following general formula [1]:

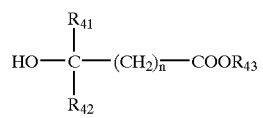

[1]

wherein $R_{41}$ is a hydrogen atom or a methyl group, $R_{42}$ is a hydrogen atom, a methyl group, an ethyl group or a phenyl group, $R_{43}$ is a straight chained, branched or cyclic alkyl group having 1 to 6 carbon atoms, and n is 0 or 1, wherein an amount of the compound to be used is 0.5 to 30 wt % relative to the total amount of the resist composition, applying the resist composition to a special substrate being selected from the group consisting of SiN, TiN, SiON, BPSG and a strong basic organic anti-reflective film, wherein the resist composition is one containing a) a polymer which becomes soluble in an aqueous alkaline developing solution by a chemical change by an action of an acid, b) an acid generator.

2. A method for reducing substrate dependence of a resist composition as claimed in claim 1, wherein the polymer which becomes soluble in an aqueous alkaline developing solution by a chemical change by an action of an acid is a compound shown by the general formula [2] or [3]:

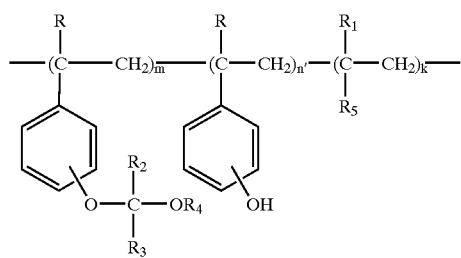

[2]

wherein R and $R_1$ are independently a hydrogen atom or a methyl group, $R_2$ and $R_3$ are independently a hydrogen atom, a lower alkyl group or an aryl group, except for the case where $R_2$ and $R_3$ are both hydrogen atoms, and $R_2$ and $R_3$ may form together an alkylene ring; $R_4$ is a lower alkyl group or an aralkyl group; $R_5$ is a cyano group, a carboxylic group which may be esterified or a phenyl group which may be substituted; m and n' are a natural number; and k is 0 or a natural number, provided that m>k;

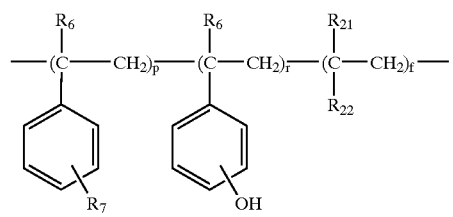

[3]

wherein $R_6$ and $R_{21}$ are independently a hydrogen atom or a methyl group; $R_7$ is a hydrogen atom, a lower alkyl group, a lower alkoxy group, an acyloxy group, a 5- to 6-membered saturated heterocyclic oxy group or a group shown by the formula of $R_8O—CO—(CH_2)z—O—$ in which $R_8$ is an alkyl group and z is 0 or a natural number; $R_{22}$ is a cyano group, a phenyl group which may have a substituent or a carboxyl group which may be esterified; p and r are natural number; f is 0 or a natural number, provided that p>f; with the proviso that when $R_7$ is a hydrogen atom, a lower alkyl group, a lower alkoxy group except for one which is easily changed into a hydroxy group by an acid, an acyloxy group or a group $R_8O—CO—(CH_2)z—O—$ (in which $R_8$ and z have the same meaning as above) except for a case where $R_8$ is a group labile by an acid, $R_{22}$ is a phenyl group having a substituent which is easily changed into a hydroxy group or a group of $—COOR_{45}$ (in which $R_{45}$ is an alkyl group labile by an acid) and that when $R_7$ is an alkoxy group which is easily changed into a hydroxy group, a 5- to 6-membered saturated oxy group or a group of $R_8O—CO—(CH_2)z—O—$ (in which $R_8$ and z have the same meaning as above) in which $R_8$ is labile by an acid, $R_{22}$ is a cyano group, a phenyl group which may have a substituent or a carboxyl group which may be esterified.

3. A method for reducing substrate dependence of a resist composition as claimed in claim 1, wherein the polymer which becomes soluble in an aqueous alkaline developing solution by a chemical change by an action of an acid is a poly(p-1-ethoxyethoxystyrene/styrene/p-hydroxystyrene/tert-butyl acrylate) or poly(p-1-ethoxyethoxystyrene/styrene/p-hydroxystyrene/tert-butyl methacrylate).

4. A method for reducing substrate dependence of a resist composition as claimed in claim 1, wherein the acid generator is a compound represented by the general formula [8], [9], [11], [12], [13] and [15];

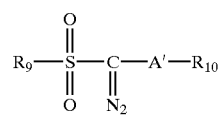

[8]

wherein $R_9$ and $R_{10}$ are independently an alkyl group or a haloalkyl group and A' is a sulfonyl group or a carbonyl group;

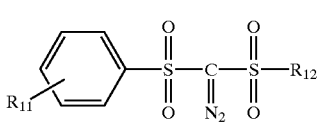

[9]

wherein $R_{11}$ is a hydrogen atom, a halogen atom, an alkyl group, an alkoxy group or a haloalkyl group, and $R_{12}$ is an alkyl group, a haloalkyl group or a group shown by the following general formula [10]:

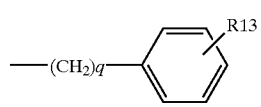

[10]

wherein $R_{13}$ is a hydrogen atom, a halogen atom, an alkyl group, an alkoxy group or a haloalkyl group, and q is 0 or an integer of 1 to 3;

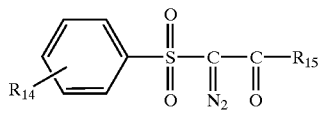
[11]

wherein $R_{14}$ is a hydrogen atom, a halogen atom, an alkyl group or a trifluoromethyl group and $R_{15}$ is an alkyl group, an aralkyl group, an alkoxy group, a phenyl group or a tolyl group;

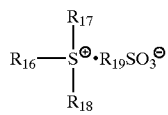
[12]

wherein $R_{16}$ is an alkyl group, a phenyl group, a substituted phenyl group or an aralkyl group, $R_{17}$ and $R_{18}$ are independently a hydrogen atom, an alkyl group, a phenyl group, a substituted phenyl group or an aralkyl group, and $R_{19}$ is a fluoroalkyl group, a trifluoromethylphenyl group, a methyl group or tolyl group;

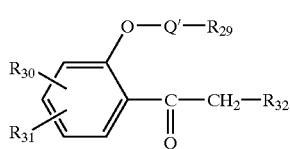
[13]

wherein $R_{29}$ is an alkyl group, a fluoroalkyl group, a phenyl group, a substituted phenyl group or an aralkyl group, Q' is a sulfonyl group or a carbonyl group, $R_{30}$ and $R_{31}$ are independently a hydrogen atom, a methyl group, a methoxy group, a nitro group, a cyano group, a hydroxy group or a group shown by the following general formula [14]:

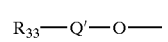
[14]

wherein $R_{33}$ is an alkyl group, a fluoroalkyl group, a phenyl group, a substituted phenyl group or an aralkyl group, Q' is a sulfonyl group or a carbonyl group, and $R_{32}$ is a hydrogen atom, a methyl group or an ethyl group;

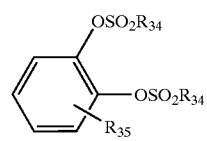
[15]

wherein $R_{34}$ is an alkyl group, a fluoroalkyl group, a phenyl group, a substituted phenyl group or an aralkyl group, $R_{35}$ is a hydrogen atom, a methyl group, a fluoroalkyl group, a methoxy group, a nitro group, a cyano group, a hydroxy group or a group shown by the above general formula [14].

5. A method for reducing substrate dependence of a resist composition, which comprises the steps of:

incorporating into the resist composition, as an agent for reducing substrate dependence, a compound shown by the following general formula [1]:

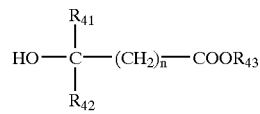
[1]

wherein $R_{41}$ is a hydrogen atom or a methyl group, $R_{42}$ is a hydrogen atom, a methyl group, an ethyl group or a phenyl group, $R_{43}$ is a straight chained, branched or cyclic alkyl group having 1 to 6 carbon atoms, and n is 0 or 1, wherein an amount of the compound to be used is 0.5 to 30 wt % relative to the total amount of the resist composition, applying the resist composition to a special substrate being selected from the group consisting of SiN, TiN, SiON, BPSG and a strong basic organic anti-reflective film, wherein the resist composition is one containing a) a polymer soluble in an aqueous alkaline developing solution, b) an acid generator, c) a cross-linking compound which can make the polymer soluble in an aqueous alkaline developing solution hardly soluble in an aqueous alkaline developing solution by a chemical change by an action of an acid.

6. A method for reducing substrate dependence of a resist composition as claimed in claim 5, wherein the polymer soluble in an aqueous alkaline developing solution is poly (p-hydroxystyrene), poly(styrene/p-hydroxystyrene) wherein the ratio of styrene units to p-hydroxystyrene units is limited to 4 or less:6 or more, said ratio being hereinafter represented by 4↓:6↑, poly(p-tert-butoxystyrene/p-hydroxystyrene) wherein the ratio of p-tert-butoxystyrene units to p-hydroxystyrene units is limited to 2↓:8↑, poly(p-isopropoxystyrene/p-hydroxystyrene) wherein the ratio of p-isopropoxystyrene units to p-hydroxystyrene units is limited to 2↓:8↑, poly(p-tetrahydropyranyloxystyrene/p-hydroxystyrene) wherein the ratio of p-tetrahydropyranyloxystyrene units to p-hydroxystyrene units is limited to 2↓:8↑, poly(p-tert-butoxycarbonyloxystyrene/p-hydroxystyrene) wherein the ratio of p-tert-butoxycarbonyloxystyrene units to p-hydroxystyrene units is limited to 2↓:8↑, poly(p-1-ethoxyethoxystyrene/p-hydroxystyrene) wherein the ratio of p-1-ethoxyethoxystyrene units to p-hydroxystyrene units is limited to 2↓:8↑, poly(p-1-ethoxyethoxystyrene/p-tert-butoxystyrene/p-hydroxystyrene) wherein the ratio of the sum of p-1-ethoxyethoxystyrene units and p-tert-butoxystyrene units to p-hydroxystyrene units is limited to 2↓:8↑, poly(p-1-ethoxyethoxystyrene/styrene/p-hydroxystyrene) wherein the ratio of the sum of p-1-ethoxyethoxystyrene units and styrene units to p-hydroxystyrene units is limited to 2↓:8↑, poly(p-hydroxystyrene/styrene/tert-butyl acrylate) wherein the ratio of p-hydroxystyrene units to the sum of styrene units and tert-butyl acrylate units is limited to 7↑:3↓ or poly(p-hydroxystyrene/styrene/tert-butyl methacrylate) wherein the ratio of p-hydroxystyrene units to the sum of styrene units and tert-butyl methacrylate units is limited to 7↑:3↓.

7. A method for reducing substrate dependence of a resist composition as claimed in claim 5, wherein the acid generator is a compound represented by the general formula (8), (9), (11), (12), (13) and (15);

(8)

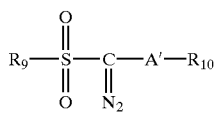

wherein $R_9$ and $R_{10}$ are independently an alkyl group or a haloalkyl group and A' is a sulfonyl group or a carbonyl group;

(9)

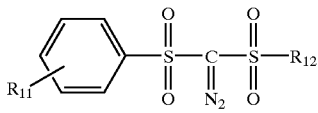

wherein $R_{11}$ is a hydrogen atom, a halogen atom, an alkyl group, an alkoxy group or a haloalkyl group, and $R_{12}$ is an alkyl group, a haloalkyl group or a group shown by the following general formula (10):

[10]

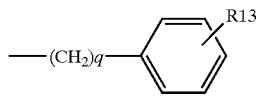

wherein $R_{13}$ is a hydrogen atom, a halogen atom, an alkyl group, an alkoxy group or a haloalkyl group, and q is 0 or an integer of 1 to 3;

(11)

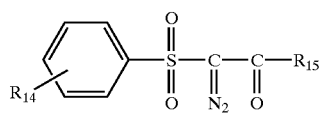

wherein $R_{14}$ is a hydrogen atom, a halogen atom, an alkyl group or a trifluoromethyl group and $R_{15}$ is an alkyl group, an aralkyl group, an alkoxy group, a phenyl group or a tolyl group;

[12]

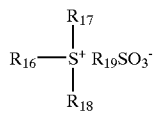

wherein $R_{16}$ is an alkyl group, a phenyl group, a substituted phenyl group or an aralkyl group, $R_{17}$ and $R_{18}$ are independently a hydrogen atom, an alkyl group, a phenyl group, a substituted phenyl group or an aralkyl group, and $R_{19}$ is a fluoroalkyl group, a trifluoromethylphenyl group, a methyl group or a tolyl group;

(13)

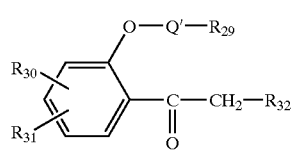

wherein $R_{29}$ is an alkyl group, a fluoroalkyl group, a phenyl group, a substituted phenyl group or an aralkyl group, Q' is a sulfonyl group or a carbonyl group, $R_{30}$ and $R_{31}$ are independently a hydrogen atom, a methyl group, a methoxy group, a nitro group, a cyano group, a hydroxy group or a group shown by the following general formula (14):

(14)

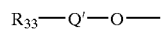

wherein $R_{33}$ is an alkyl group, a fluoroalkyl group, a phenyl group, a substituted phenyl group or an aralkyl group, Q' is a sulfonyl group or a carbonyl group, and $R_{32}$ is a hydrogen atom, a methyl group or an ethyl group;

(15)

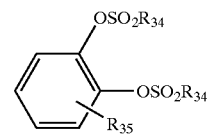

wherein $R_{34}$ is an alkyl group, a fluoroalkyl group, a phenyl group, a substituted phenyl group or an aralkyl group, $R_{35}$ is a hydrogen atom, a methyl group, a fluoroalkyl group, a methoxy group, a nitro group, a cyano group, a hydroxy group or a group shown by the above general formula (14).

8. A method for reducing substrate dependence of a resist composition as claimed in claim 5, wherein the cross-linking compound is one shown by the general formula [4];

[4]

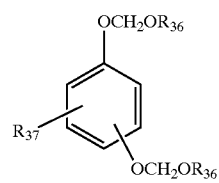

wherein $R_{36}$ is an alkyl group, $R_{37}$ is a hydrogen atom or a group shown by the general formula [5]:

[5]

wherein $R_{36}$ has the same meaning as above, or one shown by the general formula [6];

[6]

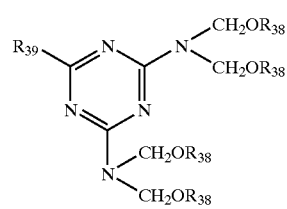

wherein $R_{38}$ is a hydrogen atom or an alkyl group, and $R_{39}$ is a hydrogen atom or a group shown by the general formula [7]:

[7]

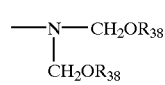

wherein $R_{38}$ has the same meaning as above.

9. A coated substrate comprising:
a special substrate made of a material selected from the group consisting of SiN, TiN, SiON, BPSG and a strong basic organic anti-reflective film; and
a resist film obtained by coating a resist composition on said substrate, said resist composition comprising:
a) a compound shown by the following general formula [1]:

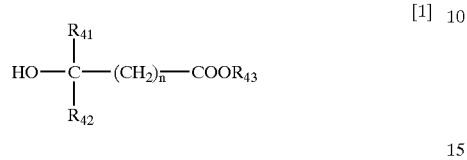

wherein $R_{41}$ is a hydrogen atom or a methyl group, $R_{42}$ is a hydrogen atom, a methyl group, an ethyl group or a phenyl group, $R_{43}$ is a straight chained, branched or cyclic alkyl group having 1 to 6 carbon atoms, and n is 0 or 1, wherein an amount of the compound to be used is 0.5 to 30 wt % relative to the total amount of the resist composition,
b) a polymer which becomes soluble in an aqueous alkaline developing solution by a chemical change by an action of an acid, and
c) an acid generator;
wherein the polymer which becomes soluble in an aqueous alkaline developing solution by a chemical change by an action of an acid is a compound shown by the general formula [2] or [3]:

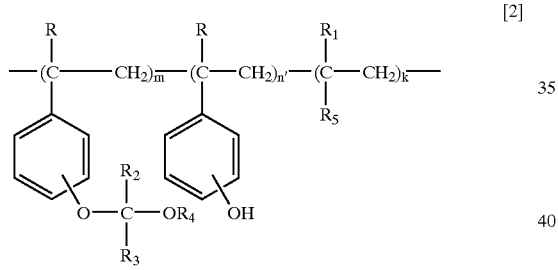

wherein R and $R_1$ are independently a hydrogen atom or a methyl group, $R_2$ and $R_3$ are independently a hydrogen atom, a lower alkyl group or an aryl group, except for the case where $R_2$ and $R_3$ are both hydrogen atoms, and $R_2$ and $R_3$ may form together an alkylene ring; $R_4$ is a lower alkyl group or an aralkyl group; $R_5$ is a cyano group; a carboxylic group which may be esterified or a phenyl group which may be substituted; m and n' are a natural number; and k is 0 or a natural number provided that m>k;

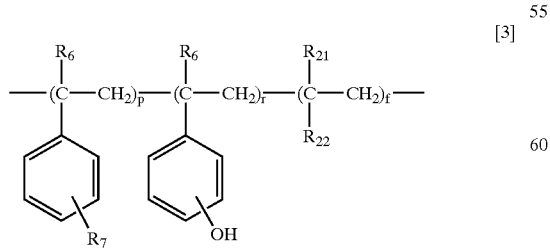

wherein $R_6$ and $R_{21}$ are independently a hydrogen atom or a methyl group; $R_7$ is a hydrogen atom, a lower alkyl group, a lower alkoxy group, an acyloxy group, a 5- or 6-membered saturated heterocyclic oxy group or a group shown by the formula of $R_8O-CO-(CH_2)z-O-$ in which $R_8$ is an alkyl group or z is 0 or a natural number; $R_{22}$ is a cyano group, a phenyl group which may have a substituent or a carboxyl group which may be esterified; p and r are natural number; f is 0 or a natural number, provided that p>f; with the proviso that when $R_7$ is a hydrogen atom, a lower alkyl group, a lower alkoxy group except for one which is easily changed into a hydroxy group by an acid, an acyloxy group or a group $R_8O-CO-(CH_2)z-O-$ (in which $R_8$ and z have the same meaning as above) except for a case where $R_8$ is a group labile by an acid, $R_{22}$ is a phenyl group having a substituent which is easily changed into a hydroxy group or a group of $-COOR_{45}$ (in which $R_{45}$ is an alkyl group labile by an acid) an that when $R_7$ is an alkoxy group which is easily changed into a hydroxy group, a 5- or 6-membered saturated oxy group or a group of $R_8O-CO-(CH_2)z-O-$ (in which $R_8$ and z have the same meaning as above) in which $R_8$ is labile by an acid, $R_{22}$ is a cyano group, a phenyl group which may have a substituent or a carboxyl group which may be esterified.

10. A coated substrate comprising:
a special substrate made of a material selected from the group consisting of SiN, TiN, SiON, BPSG and a strong basic organic anti-reflective film; and
a resist film obtained by coating a resist composition on said substrate, said resist composition comprising:
a) a compound shown by the following general formula [1]:

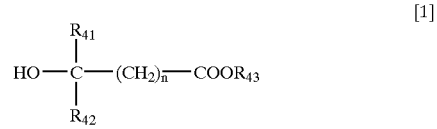

wherein $R_{41}$ is a hydrogen atom or a methyl group, $R_{42}$ is a hydrogen atom, a methyl group, an ethyl group or a phenyl group, $R_{43}$ is a straight chained, branched or cyclic alkyl group having 1 to 6 carbon atoms, and n is 0 or 1, wherein an amount of the compound to be used is 0.5 to 30 wt % relative to the total amount of the resist composition,
b) a polymer which becomes soluble in an aqueous alkaline developing solution by a chemical change by an action of an acid, and
c) an acid generator;
wherein the polymer which becomes soluble in an aqueous alkaline developing solution by a chemical change by an action of an acid is a poly(p-1-ethoxyethoxystyrene/styrene/p-hydroxystyrene/tert-butyl acrylate) or poly(p-1-ethoxyethoxystyrene/styrene/p-hydroxystyrene/tert-butyl methacrylate).

11. A coated substrate comprising:
a special substrate made of a material selected from the group consisting of SiN, TiN, SiON, BPSG and a strong basic organic anti-reflective film; and
a resist film obtained by coating a resist composition on said substrate, said resist composition comprising:

a) a compound shown by the following general formula [1]:

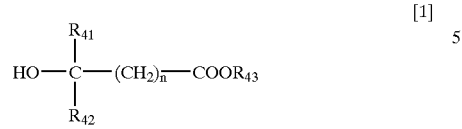

[1]

wherein $R_{41}$ is a hydrogen atom or a methyl group, $R_{42}$ is a hydrogen atom, a methyl group, an ethyl group or a phenyl group, $R_{43}$ is a straight chained, branched or cyclic alkyl group having 1 to 6 carbon atoms, and n is 0 or 1, wherein an amount of the compound to be used is 0.5 to 30 wt % relative to the total amount of the resist composition, b) a polymer which becomes soluble in an aqueous alkaline developing solution by a chemical change by an action of an acid, and c) an acid generator;
wherein the acid generator is a compound represented by the general formula [8], [9], [11], [12], [13] and [15];

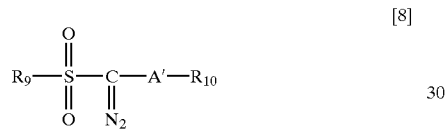

[8]

wherein $R_9$ and $R_{10}$ are independently an alkyl group or a haloalkyl group and A' is a sulfonyl group or a carbonyl group;

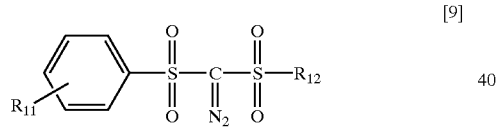

[9]

wherein $R_{11}$ is a hydrogen atom, a halogen atom, an alkyl group, an alkoxy group or a haloalkyl group, and $R_{12}$ is an alkyl group, a haloalkyl group or a group shown by the following general formula [10]:

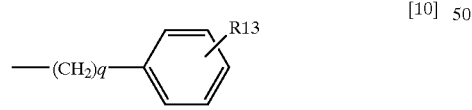

[10]

wherein $R_{13}$ is a hydrogen atom, a halogen atom, an alkyl group, an alkoxy group or a halogen group, and q is 0 or an integer of 1 to 3;

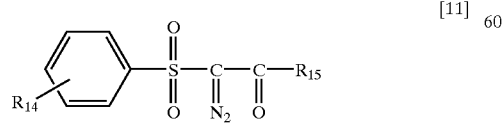

[11]

wherein $R_{14}$ is a hydrogen atom, a halogen atom, an alkyl group or a trifluoromethyl group and $R_{15}$ is an alkyl group, an aralkyl group, an alkoxy group, a phenyl group or a tolyl group;

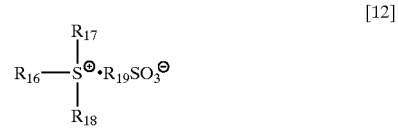

[12]

wherein $R_{16}$ is an alkyl group, a phenyl group, a substituted phenyl group or an aralkyl group, $R_{17}$ and $R_{18}$ are independently a hydrogen atom, an alkyl group, a phenyl group, a substituted phenyl group or an aralkyl group, and $R_{19}$ is a fluoroalkyl group, a trifluoromethylphenyl group, a methyl group or tolyl group;

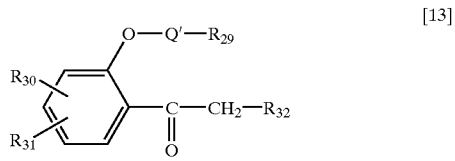

[13]

wherein $R_{29}$ is an alkyl group, a fluoroalkyl group, a phenyl group, a substituted phenyl group or an aralkyl group, Q' is a sulfonyl group or a carbonyl group, $R_{30}$ and $R_{31}$ are independently a hydrogen atom, a methyl group, a methoxy group, a nitro group, a cyano group, a hydroxy group or a group shown by the following general formula [14]:

[14]

wherein $R_{33}$ is an alkyl group, a fluoroalkyl group, a phenyl group, a substituted phenyl group or an aralkyl group, Q' is a sulfonyl group or a carbonyl group, and $R_{32}$ us a hydrogen atom, a methyl group or an ethyl group;

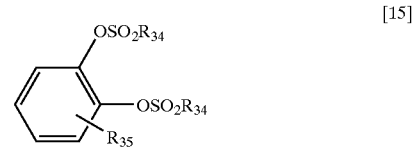

[15]

wherein $R_{34}$ is an alkyl group, a fluoroalkyl group, a phenyl group, a substituted phenyl group or an aralkyl group, $R_{35}$ is a hydrogen atom, a methyl group, a fluoroalkyl group, a methoxy group, a nitro group, a cyano group, a hydroxy group or a group shown by the above general formula [14].

12. A coated substrate comprising:

a special substrate made of a material selected from the group consisting of SiN, TiN, SiON, BPSG and a strong basic organic anti-reflective film; and a resist film obtained by coating a resist composition on said substrate, said resist composition comprising:

a) a compound shown by the following general formula [1]

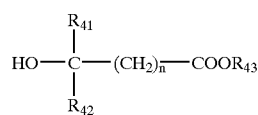

[1]

wherein $R_{41}$ is a hydrogen atom or a methyl group, $R_{42}$ is a hydrogen atom, a methyl group, an ethyl group or a phenyl group, $R_{43}$ is a straight chained, branched or cyclic alkyl group having 1 to 6 carbon atoms, and n is 0 or 1, wherein an amount of the compound to be used is 0.5 to 30 wt % relative to the total amount of the resist composition,
   b) a polymer soluble in an aqueous alkaline developing solution,
   c) an acid generator, and
   d) a cross-linking compound which can make a polymer hardly soluble in an aqueous alkaline developing solution by a chemical change by an action of an acid.

13. The coated substrate as claimed in claim 12, wherein the compound shown by the general formula [1] is methyl glycolate, ethyl glycolate, n-propyl glycolate, isopropyl glycolate, n-butyl glycolate, isobutyl glycolate, tert-butyl glycolate, n-pentyl glycolate, isopentyl glycolate, n-hexyl glycolate, cyclohexyl glycolate, methyl 3-hydroxypropionate, ethyl 3-hydroxypropionate, n-propyl 3-hydroxypropionate, methyl 2-hydroxybutyrate, ethyl 2-hydroxybutyrate, n-propyl 2-hydroxybutyrate, methyl 2-hydroxyisobutyrate, ethyl 2-hydroxyisobutyrate, methyl 3-hydroxybutyrate, ethyl 3-hydroxybutyrate, methyl 3-hydroxyvalerate, ethyl 3-hydroxyvalerate, methyl mandelate, ethyl mandelate, n-propyl mandelate or isopropyl mandelate.

14. The coated substrate as claimed in claim 12, wherein the compound shown by the general formula [1] is methyl glycolate, ethyl glycolate, methyl 2-hydroxybutyrate, ethyl 2-hydroxybutyrate, methyl 3-hydroxybutyrate, ethyl 3-hydroxybutyrate, methyl mandelate or ethyl mandelate.

15. The coated substrate as claimed in claim 12, wherein the compound shown by the general formula [1] the compound is methyl glycolate, ethyl glycolate, methyl 3-hydroxybutyrate, ethyl 3-hydroxybutyrate or ethyl mandelate.

16. The coated substrate as claimed in claim 12, wherein the polymer soluble in an aqueous alkaline developing solution is poly(p-hydroxystyrene), poly(styrene/p-hydroxystyrene) wherein the ratio of styrene units to p-hydroxystyrene units is limited to 4 or less:6 or more, said ratio being hereinafter represented by 4↓:6↑, poly(p-tert-butoxystyrene/p-hydroxystyrene) wherein the ratio of p-tert-butoxystyrene units to p-hydroxystyrene units is limited to 2↓:8↑, poly(p-isopropoxystyrene/p-hydroxystyrene) wherein the ratio of p-isopropoxystyrene units to p-hydroxystyrene units is limited to 2↓:8↑, poly(p-tetrahydropyranyloxystyrene/p-hydroxystyrene) wherein the ratio of p-tetrahydropyranyloxystyrene units to p-hydroxystyrene units is limited to 2↓:8↑, poly(p-tert-butoxycarbonyloxystyrene/p-hydroxystyrene) wherein the ratio of p-tert-butoxycarbonyloxystyrene units to p-hydroxystyrene units is limited to 2↓:8↑, poly(p-1-ethoxyethoxystyrene/p-hydroxystyrene) wherein the ratio of p-1-ethoxyethoxystyrene units to p-hydroxystyrene units is limited to 2↓:8↑, poly(p-1-ethoxyethoxystyrene/p-tert-butoxystyrene/p-hydroxystyrene) wherein the ratio of the sum of p-1-ethoxyethoxystyrene units and p-tert-butoxystyrene units to p-hydroxystyrene units is limited to 2↓:8↑, poly(p-1-ethoxyethoxystyrene/styrene/p-hydroxystyrene) wherein the ratio of the sum of p-1-ethoxyethoxystyrene units and styrene units to p-hydroxystyrene units is limited to 2↓:8↑, poly(p-hydroxystyrene/styrene/tert-butyl acrylate) wherein the ratio of p-hydroxystyrene units to the sum of styrene units and tert-butyl acrylate units is limited to 7↑:3↓ or poly(p-hydroxystyrene/styrene/tert-butyl methacrylate) wherein the ratio of p-hydroxystyrene units to the sum of styrene units and tert-butyl methacrylate units is limited to 7↑:3↓.

17. The coated substrate as claimed in claim 12, wherein the acid generator is a compound represented by the general formula [8], [9], [11], [12], [13] and [15];

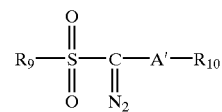

[8]

wherein $R_9$ and $R_{10}$ are independently an alkyl group or a haloalkyl group and A' is a sulfonyl group or a carbonyl group;

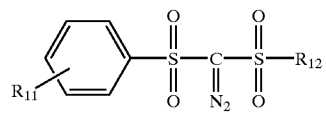

[9]

wherein $R_{11}$ is a hydrogen atom, a halogen atom, an alkyl group, an alkoxy group or a haloalkyl group, and $R_{12}$ is an alkyl group, a haloalkyl group or a group shown by the following general formula [10]:

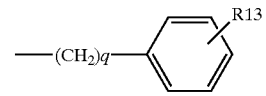

[10]

wherein $R_{13}$ is a hydrogen atom, a halogen atom, an alkyl group, an alkoxy group or a haloalkyl group, and q is 0 or an integer of 1 to 3;

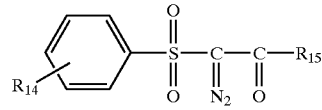

[11]

wherein $R_{14}$ is a hydrogen atom, a halogen atom, an alkyl group or a trifluoromethyl group and $R_{15}$ is an alkyl group, an aralkyl group, an alkoxy group, a phenyl group or a tolyl group;

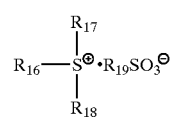

[12]

wherein $R_{16}$ is an alkyl group, a phenyl group, a substituted phenyl group or an aralkyl group, $R_{17}$ and $R_{18}$ are independently a hydrogen atom, an alkyl group, a phenyl group, a substituted phenyl group or an aralkyl group, and $R_{19}$ is a fluoroalkyl group, a trifluoromethylphenyl group, a methyl group or tolyl group;

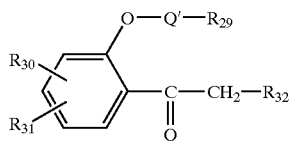

[13]

wherein $R_{29}$ is an alkyl group, a fluoroalkyl group, a phenyl group, a substituted phenyl group or an aralkyl group, Q' is a sulfonyl group or a carbonyl group, $R_{30}$ and $R_{31}$ are independently a hydrogen atom, a methyl group, a methoxy group, a nitro group, a cyano group, a hydroxy group or a group shown by the following general formula [14]:

$$R_{33}\text{---}Q'\text{---}O\text{---}$$ [14]

wherein $R_{33}$ is an alkyl group, a fluoroalkyl group, a phenyl group, a substituted phenyl group or an aralkyl group, Q' is a sulfonyl group or a carbonyl group, and $R_{32}$ is a hydrogen atom, a methyl group or an ethyl group;

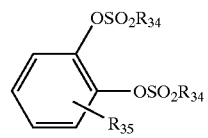

[15]

wherein $R_{34}$ is an alkyl group, a fluoroalkyl group, a phenyl group, a substituted phenyl group or an aralkyl group, $R_{35}$ is a hydrogen atom, a methyl group, a fluoroalkyl group, a methoxy group, a nitro group, a cyano group, a hydroxy group or a group shown by the above general formula [14].

18. The coated substrate as claimed in claim 12, wherein the cross-linking compound is one shown by the general formula [4];

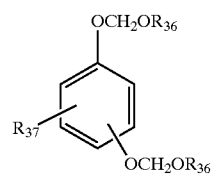

[4]

wherein $R_{36}$ is an alkyl group, $R_{37}$ is a hydrogen atom or a group shown by the general formula [5]:

$$\text{---}OCH_2OR_{36}$$ [5]

wherein $R_{36}$ has the same meaning as above, or one shown by the general formula [6];

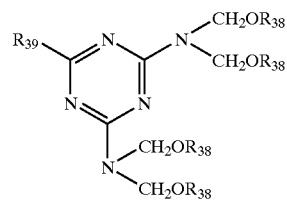

[6]

wherein $R_{38}$ is a hydrogen atom or an alkyl group, and $R_{39}$ is a hydrogen atom or a group shown by the general formula [7]:

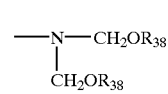

[7]

wherein $R_{38}$ has the same meaning as above.

19. A resist composition for a special substrate being selected from the group consisting of SiN, TiN, SiON, BPSG and a strong basic organic anti-reflective film, which comprises;

a) a compound selected from the group consisting of methyl glycolate, ethyl glycolate, n-propyl glycolate, isopropyl glycolate, n-butyl glycolate, isobutyl glycolate, tert-butyl glycolate, n-pentyl glycolate, isopentyl glycolate, n-hexyl glycolate, cyclohexyl glycolate, methyl 3-hydroxypropionate, ethyl 3-hydroxypropionate, n-propyl 3-hydroxypropionate, methyl 2-hydroxybutyrate, ethyl 2-hydroxybutyrate, n-propyl 2-hydroxybutyrate, methyl 2-hydroxyisobutyrate, ethyl 2-hydroxyisobutyrate, methyl 3-hydroxybutyrate, ethyl 3-hydroxybutyrate, methyl 3-hydroxyvalerate, ethyl 3-hydroxyvalerate, methyl mandelate, ethyl mandelate, n-propyl mandelate and isopropyl mandelate, b) a polymer which becomes soluble in an aqueous alkaline developing solution by a chemical change by an action of an acid, and c) an acid generator.

20. The resist composition as claimed in claim 19, wherein an amount of the compound to be used is 0.5 to 30 wt % relative to the total amount of the resist composition.

21. The resist composition as claimed in claim 19, wherein the compound is methyl glycolate, ethyl glycolate, methyl 2-hydroxybutyrate, ethyl 2-hydroxybutyrate, methyl 3-hydroxybutyrate, ethyl 3-hydroxybutyrate, methyl mandelate or ethyl mandelate.

22. The resist composition as claimed in claim 19, wherein the compound is methyl glycolate, ethyl glycolate, methyl 3-hydroxybutyrate, ethyl 3-hydroxybutyrate or ethyl mandelate.

23. The resist composition as claimed in claim 19, wherein the polymer which becomes soluble in an aqueous alkaline developing solution by a chemical change by an action of an acid is a compound shown by the general formula [2] or [3]:

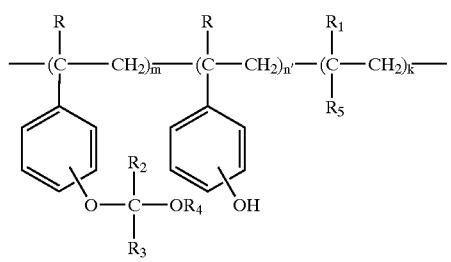

[2]

wherein R and $R_1$ are independently a hydrogen atom or a methyl group, $R_2$ and $R_3$ are independently a hydrogen atom, a lower alkyl group or an aryl group, except for the case where $R_2$ and $R_3$ are both hydrogen atoms, and $R_2$ and $R_3$ may form together an alkylene ring; $R_4$ is a lower alkyl group or an aralkyl group; $R_5$ is a cyano group, a carboxylic group which may be esterified or a phenyl group which may be substituted; m and n' are a natural number; and k is 0 or a natural number, provided that m>k;

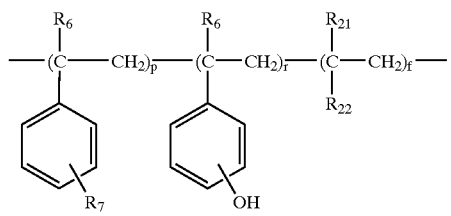

[3]

wherein $R_6$ and $R_{21}$ are independently a hydrogen atom or a methyl group; $R_7$ is a hydrogen atom, a lower alkyl group, a lower alkoxy group, an acyloxy group, a 5- to 6-membered saturated heterocyclic oxy group or a group shown by the formula of $R_8O$—CO—$(CH_2)z$—O— in which $R_8$ is an alkyl group and z is 0 or a natural number; $R_{22}$ is a cyano group, a phenyl group which may have a substituent or a carboxyl group which may be esterified; p and r are natural number; f is 0 or a natural number, provided that p>f; with the proviso that when $R_7$ is a hydrogen atom, a lower alkyl group, a lower alkoxy group except for one which is easily changed into a hydroxy group by an acid, an acyloxy group or a group $R_8O$—CO—$(CH_2)z$—O— (in which $R_8$ and z have the same meaning as above) except for a case where $R_8$ is a group labile by an acid, $R_{22}$ is a phenyl group having a substituent which is easily changed into a hydroxy group or a group of —$COOR_{45}$ (in which $R_{45}$ is an alkyl group labile by an acid) and that when $R_7$ is an alkoxy group which is easily changed into a hydroxy group, a 5- to 6-membered saturated oxy group or a group of $R_8O$—CO—$(CH_2)z$—O— (in which $R_8$ and z have the same meaning as above) in which $R_8$ is labile by an acid, $R_{22}$ is a cyano group, a phenyl group which may have a substituent or a carboxyl group which may be esterified.

24. The resist composition as claimed in claim 19, wherein the polymer which becomes soluble in an aqueous alkaline developing solution by a chemical change by an action of an acid is a poly(p-1-ethoxyethoxystyrene/styrene/p-hydroxystyrene/tert-butyl acrylate) or poly(p-1-ethoxyethoxystyrene/styrene/p-hydroxystyrene/tert-butyl methacrylate).

25. The resist composition as claimed in claim 19, wherein the acid generator is a compound represented by the general formula [8], [9], [11], [12], [13] and [15];

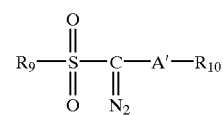

[8]

wherein $R_9$ and $R_{10}$ are independently an alkyl group or a haloalkyl group and A' is a sulfonyl group or a carbonyl group;

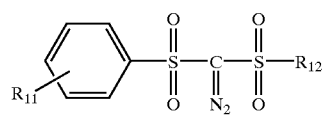

[9]

wherein $R_{11}$ is a hydrogen atom, a halogen atom, an alkyl group, an alkoxy group or a haloalkyl group, and $R_{12}$ is an alkyl group, a haloalkyl group or a group shown by the following general formula [10]:

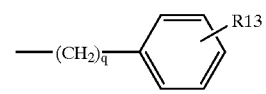

[10]

wherein $R_{13}$ is a hydrogen atom, a halogen atom, an alkyl group, an alkoxy group or a haloalkyl group, and q is 0 or an integer of 1 to 3;

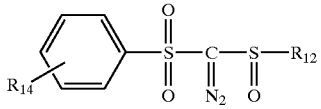

[11]

wherein $R_{14}$ is a hydrogen atom, a halogen atom, an alkyl group or a trifluoromethyl group and $R_{15}$ is an alkyl group, an aralkyl group, an alkoxy group, a phenyl group or a tolyl group;

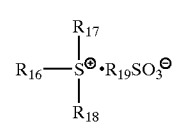

[12]

wherein $R_{16}$ is an alkyl group, a phenyl group, a substituted phenyl group or an aralkyl group, $R_{17}$ and $R_{18}$ are independently a hydrogen atom, an alkyl group, a phenyl group, a substituted phenyl group or an aralkyl group, and $R_{19}$ is a fluoroalkyl group, a trifluoromethylphenyl group, a methyl group or tolyl group;

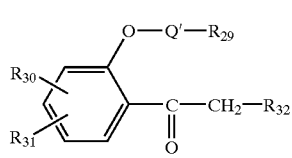

[13]

wherein $R_{29}$ is an alkyl group, a fluoroalkyl group, a phenyl group, a substituted phenyl group or an aralkyl group, Q' is a sulfonyl group or a carbonyl group, $R_{30}$ and $R_{31}$ are independently a hydrogen atom, a methyl group, a methoxy group, a nitro group, a cyano group, a hydroxy group or a group shown by the following general formula [14]:

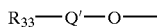
[14]

wherein $R_{33}$ is an alkyl group, a fluoroalkyl group, a phenyl group, a substituted phenyl group or an aralkyl group, Q' is a sulfonyl group or a carbonyl group, and $R_{32}$ is a hydrogen atom, a methyl group or an ethyl group;

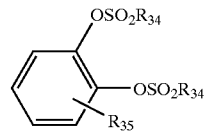
[15]

wherein $R_{34}$ is an alkyl group, a fluoroalkyl group, a phenyl group, a substituted phenyl group or an aralkyl group, $R_{35}$ is a hydrogen atom, a methyl group, a fluoroalkyl group, a methoxy group, a nitro group, a cyano group, a hydroxy group or a group shown by the above general formula [14].

26. A resist composition for a special substrate being selected from the group consisting of SiN, TiN, SiON, BPSG and a strong basic organic anti-reflective film, which comprises;
   a) a compound selected from the group consisting of methyl glycolate, ethyl glycolate, n-propyl glycolate, isopropyl glycolate, n-butyl glycolate, isobutyl glycolate, tert-butyl glycolate, n-pentyl glycolate, isopentyl glycolate, n-hexyl glycolate, cyclohexyl glycolate, methyl 3-hydroxypropionate, ethyl 3-hydroxypropionate, n-propyl 3-hydroxypropionate, methyl 2-hydroxybutyrate, ethyl 2-hydroxybutyrate, n-propyl 2-hydroxybutyrate, methyl 2-hydroxyisobutyrate, ethyl 2-hydroxyisobutyrate, methyl 3-hydroxybutyrate, ethyl 3-hydroxybutyrate, methyl 3-hydroxyvalerate, ethyl 3-hydroxyvalerate, methyl mandelate, ethyl mandelate, n-propyl mandelate and isopropyl mandelate,
   b) a polymer soluble in an aqueous alkaline developing solution,
   c) an acid generator, and
   d) a compound which becomes soluble in an aqueous alkaline developing solution by a chemical change by an action of an acid.

27. The resist composition as claimed in claim 26, wherein an amount of the compound to be used is 0.5 to 30 wt % relative to the total amount of the resist composition.

28. The resist composition as claimed in claim 26, wherein the compound is methyl glycolate, ethyl glycolate, methyl 2-hydroxybutyrate, ethyl 2-hydroxybutyrate, methyl 3-hydroxybutyrate, ethyl 3-hydroxybutyrate, methyl mandelate or ethyl mandelate.

29. The resist composition as claimed in claim 26, wherein the compound is methyl glycolate, ethyl glycolate, methyl 3-hydroxybutyrate, ethyl 3-hydroxybutyrate, or ethyl mandelate.

30. The resist composition as claimed in claim 26, wherein the polymer soluble in an aqueous alkaline developing solution is poly(p-hydroxystyrene), poly(styrene/p-hydroxystyrene) wherein the ratio of styrene units to p-hydroxystyrene units is limited to 4 or less:6 or more, said ratio being hereinafter represented by 4↓:6↑, poly(p-tert-butoxystyrene/p-hydroxystyrene) wherein the ratio of p-tert-butoxystyrene units to p-hydroxystyrene units is limited to 2↓:8↑, poly(p-isopropoxystyrene/p-hydroxystyrene) wherein the ratio of p-isopropoxystyrene units to p-hydroxystyrene units is limited to 2↓:8↑, poly(p-tetrahydropyranyloxystyrene/p-hydroxystyrene) wherein the ratio of p-tetrahydropyranyloxystyrene units to p-hydroxystyrene units is limited to 2↓:8↑, poly(p-tert-butoxycarbonyloxystyrene/p-hydroxystyrene) wherein the ratio of p-tert-butoxycarbonyloxystyrene units to p-hydroxystyrene units is limited to 2↓:8↑, poly(p-1-ethoxyethoxystyrene/p-hydroxystyrene) wherein the ratio of p-1-ethoxyethoxystyrene units to p-hydroxystyrene units is limited to 2↓:8↑, poly(p-1-ethoxyethoxystyrene/p-tert-butoxystyrene/p-hydroxystyrene) wherein the ratio of the sum of p-1-ethoxyethoxystyrene units and p-tert-butoxystyrene units to p-hydroxystyrene units is limited to 2↓:8↑, poly(p-1-ethoxyethoxystyrene/styrene/p-hydroxystyrene) wherein the ratio of the sum of p-1-ethoxyethoxystyrene units and styrene units to p-hydroxystyrene units is limited to 2↓:8↑, poly(p-hydroxystyrene/styrene/tert-butyl acrylate) wherein the ratio of p-hydroxystyrene units to the sum of styrene units and tert-butyl acrylate units is limited to 7↑:3↓ or poly(p-hydroxystyrene/styrene/tert-butyl methacrylate) wherein the ratio of p-hydroxystyrene units to the sum of styrene units and tert-butyl methacrylate units is limited to 7↑:3↑.

31. The resist composition as claimed in claim 26, wherein the acid generator is a compound represented by the general formula [8], [9], [11], [12], [13] and [15];

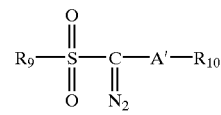
[8]

wherein $R_9$ and $R_{10}$ are independently an alkyl group or a haloalkyl group and A' is a sulfonyl group or a carbonyl group;

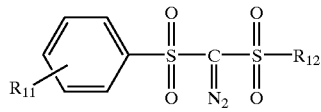
[9]

wherein $R_{11}$ is a hydrogen atom, a halogen atom, an alkyl group, an alkoxy group or a haloalkyl group, and $R_{12}$ is an alkyl group, a haloalkyl group or a group shown by the following general formula [10]:

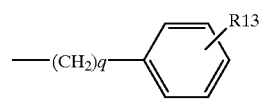
[10]

wherein $R_{13}$ is a hydrogen atom, a halogen atom, an alkyl group, an alkoxy group or a haloalkyl group, and q is 0 or an integer of 1 to 3;

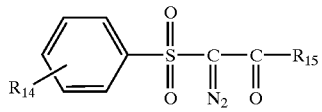

[11]

wherein $R_{14}$ is a hydrogen atom, a halogen atom, an alkyl group or a trifluoromethyl group and $R_{15}$ is an alkyl group, an aralkyl group, an alkoxy group, a phenyl group or a tolyl group;

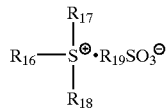

[12]

wherein $R_{16}$ is an alkyl group, a phenyl group, a substituted phenyl group or an aralkyl group, $R_{17}$ and $R_{18}$ are independently a hydrogen atom, an alkyl group, a phenyl group, a substituted phenyl group or an aralkyl group, and $R_{19}$ is a fluoroalkyl group, a trifluoromethylphenyl group, a methyl group or tolyl group;

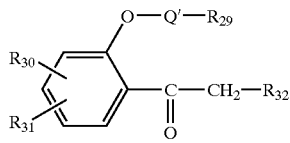

[13]

wherein $R_{29}$ is an alkyl group, a fluoroalkyl group, a phenyl group, a substituted phenyl group or an aralkyl group, Q' is a sulfonyl group or a carbonyl group, $R_{30}$ and $R_{31}$ are independently a hydrogen atom, a methyl group, a methoxy group, a nitro group, a cyano group, a hydroxy group or a group shown by the following general formula [14]:

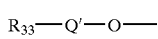

[14]

wherein $R_{33}$ is an alkyl group, a fluoroalkyl group, a phenyl group, a substituted phenyl group or an aralkyl group, Q' is a sulfonyl group or a carbonyl group, and $R_{32}$ is a hydrogen atom, a methyl group or an ethyl group;

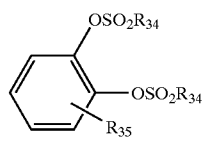

[15]

wherein $R_{34}$ is an alkyl group, a fluoroalkyl group, a phenyl group, a substituted phenyl group or an aralkyl group, $R_{35}$ is a hydrogen atom, a methyl group, a fluoroalkyl group, a methoxy group, a nitro group, a cyano group, a hydroxy group or a group shown by the above general formula [14].

32. The resist composition as claimed in claim 26, wherein the compound which becomes soluble in an aqueous alkaline developing solution by a chemical change by action of an acid is an alkaline insoluble compound in which a part or all of phenolic hydroxy groups in an alkaline soluble compound having phenolic hydroxy groups are protected by a tert-butoxycarbonyl group, a tert-butyl group, a 1-methoxyethyl group, a 1-ethoxyethyl group, a tetrahydropyranyl group or a 1-methylcyclohexyloxycarbonylmethyl group.

33. The resist composition as claimed in claim 26, wherein the compound which becomes soluble in an aqueous alkaline developing solution by an chemical change by an action of an acid is includes one shown by the following general formula [16] or

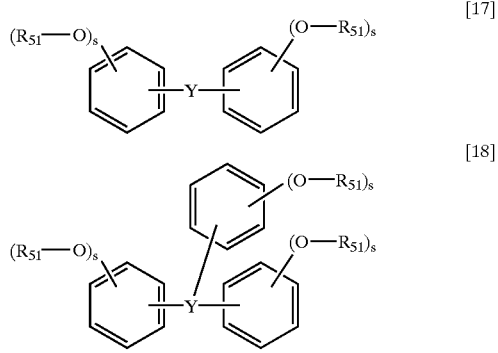

wherein $R_{51}$ is an alkyl group, an alkoxycarbonyl group, an alkoxyalkyl group, a tetrahydrofuranyl group or a tetrahydropyranyl group, s is 1 to 3, Y is a divalent or trivalent aliphatic hydrocarbon residue which may have a substituent, $(R_{51}—O)s$ means that s numbers (in which s is 2 or 3) of the group $(R_{51}—O)$ are substituted at the benzene ring, and a carbon atom in the hydrocarbon residue of Y and a carbon atom in the group shown $R_{51}$ may form together an aliphatic ring.

34. A resist composition for a special substrate being selected from the group consisting of SiN, TiN, SiON, BPSG and a strong basic organic anti-reflective film, which comprises;
  a) a compound selected from the group consisting of methyl glycolate, ethyl glycolate, n-propyl glycolate, isopropyl glycolate, n-butyl glycolate, isobutyl glycolate, tert-butyl glycolate, n-pentyl glycolate, isopentyl glycolate, n-hexyl glycolate, cyclohexyl glycolate, methyl 3-hydroxypropionate, ethyl 3-hydroxypropionate, n-propyl 3-hydroxypropionate, methyl 2-hydroxybutyrate, ethyl 2-hydroxybutyrate, n-propyl 2-hydroxybutyrate, methyl 2-hydroxyisobutyrate, ethyl 2-hydroxyisobutyrate, methyl 3-hydroxybutyrate, ethyl 3-hydroxybutyrate, methyl 3-hydroxyvalerate, ethyl 3-hydroxyvalerate, methyl mandelate, ethyl mandelate, n-propyl mandelate and isopropyl mandelate,
  b) a polymer soluble in an aqueous alkaline developing solution,
  c) an acid generator, and
  d) a cross-linking compound which can make a polymer hardly soluble in an aqueous alkaline developing solution by a chemical change by an action of an acid.

35. The resist composition as claimed in claim 34, wherein an amount of the compound to be used is 0.5 to 30 wt % relative to the total amount of the resist composition.

36. The resist composition as claimed in claim 34, wherein the compound is methyl glycolate, ethyl glycolate, methyl 2-hydroxybutyrate, ethyl 2-hydroxybutyrate, methyl 3-hydroxybutyrate, ethyl 3-hydroxybutyrate, methyl mandelate or ethyl mandelate.

37. The resist composition as claimed in claim 34, wherein the compound is methyl glycolate, ethyl glycolate, methyl 3-hydroxybutyrate, ethyl 3-hydroxybutyrate or ethyl mandelate.

38. The resist composition as claimed in claim 34, wherein the polymer soluble in an aqueous alkaline developing solution is poly(p-hydroxystyrene), poly(styrene/p-hydroxystyrene) wherein the ratio of styrene units to p-hydroxystyrene units is limited to 4 or less:6 or more, said ratio being hereinafter represented by 4↓:6↑, poly(p-tert-butoxystyrene/p-hydroxystyrene) wherein the ratio of p-tert-butoxystyrene units to p-hydroxystyrene units is limited to 2↓:8↑, poly(p-isopropoxystyrene/p-hydroxystyrene) wherein the ratio of p-isopropoxystyrene units to p-hydroxystyrene units is limited to 2↓:8↑, poly(p-tetrahydropyranyloxystyrene/p-hydroxystyrene) wherein the ratio of p-tetrahydropyranyloxystyrene units to p-hydroxystyrene units is limited to 2↓:8↑, poly(p-tert-butoxycarbonyloxystyrene/p-hydroxystyrene) wherein the ratio of p-tert-butoxycarbonyloxystyrene units to p-hydroxystyrene units is limited to 2↓:8↑, poly(p-1-ethoxyethoxystyrene/p-hydroxystyrene) wherein the ratio of p-1-ethoxyethoxystyrene units to p-hydroxyxtyrene units is limited to 2↓:8↑, poly(p-1-ethoxyethoxystyrene/p-tert-butoxystyrene/p-hydroxystyrene) wherein the ratio of the sum of p-1-ethoxyethoxystyrene units and p-tert-butoxystyrene units to p-hydroxystyrene units is limited to 2↓:8↑, poly(p-1-ethoxyethoxystyrene/styrene/p-hydroxystyrene) wherein the ratio of the sum of p-1-ethoxyethoxystyrene units and styrene units to p-hydroxystyrene units is limited to 2↓:8↑, poly(p-hydroxystyrene/styrene/tert-butyl acrylate) wherein the ratio of p-hydroxystyrene units to the sum of styrene units and tert-butyl acrylate units is limited to 7↑:3↓ or poly(p-hydroxystyrene/styrene/tert-butyl methacrylate) wherein the ratio of p-hydroxystyrene units to the sum of styrene units and tert-butyl methacrylate units is limited to 7↑:3↓.

39. The resist composition as claimed in claim 34, wherein the acid generator is a compound represented by the general formula [8], [9], [11], [12], [13] and [15];

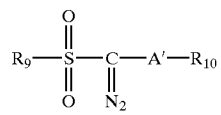
[8]

wherein $R_9$ and $R_{10}$ are independently an alkyl group or a haloalkyl group and A' is a sulfonyl group or a carbonyl group;

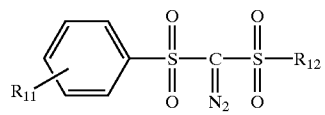
[9]

wherein $R_{11}$ is a hydrogen atom, a halogen atom, an alkyl group, an alkoxy group or a haloalkyl group, and $R_{12}$ is an alkyl group, a haloalkyl group or a group shown by the following general formula [10]:

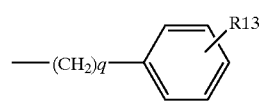
[10]

wherein $R_{13}$ is a hydrogen atom, a halogen atom, an alkyl group, an alkoxy group or a haloalkyl group, and q is 0 or an integer of 1 to 3;

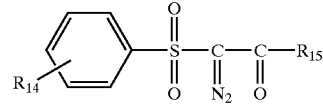
[11]

wherein $R_{14}$ is a hydrogen atom, a halogen atom, an alkyl group or a trifluoromethyl group and $R_{15}$ is an alkyl group, an aralkyl group, an alkoxy group, a phenyl group or a tolyl group;

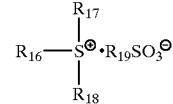
[12]

wherein $R_{16}$ is an alkyl group, a phenyl group, a substituted phenyl group or an aralkyl group, $R_{17}$ and $R_{18}$ are independently a hydrogen atom, an alkyl group, a phenyl group, a substituted phenyl group or an aralkyl group, and $R_{19}$ is a fluoroalkyl group, a trifluoromethylphenyl group, a methyl group or tolyl group;

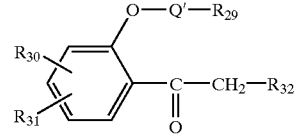
[13]

wherein $R_{29}$ is an alkyl group, a fluoroalkyl group, a phenyl group, a substituted phenyl group or an aralkyl group, Q' is a sulfonyl group or a carbonyl group, $R_{30}$ and $R_{31}$ are independently a hydrogen atom, a methyl group, a methoxy group, a nitro group, a cyano group, a hydroxy group or a group shown by the following general formula [14]:

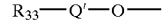
[14]

wherein $R_{33}$ is an alkyl group, a fluoroalkyl group, a phenyl group, a substituted phenyl group or an aralkyl group, Q' is a sulfonyl group or a carbonyl group, and $R_{32}$ is a hydrogen atom, a methyl group or an ethyl group;

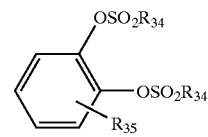
[15]

wherein $R_{34}$ is an alkyl group, a fluoroalkyl group, a phenyl group, a substituted phenyl group or an aralkyl group, $R_{35}$ is a hydrogen atom, a methyl group, a fluoroalkyl group, a methoxy group, a nitro group, a cyano group, a hydroxy group or a group shown by the above general formula [14].

40. The resist composition as claimed in claim 34, wherein the cross-linking compound is one shown by the general formula [4];

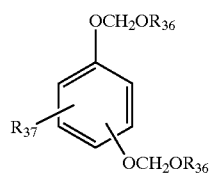
[4]
wherein $R_{36}$ is an alkyl group, $R_{37}$ is a hydrogen atom or a group shown by the general formula [5]:
—OCH$_2$OR$_{36}$   [5]
wherein $R_{36}$ has the same meaning as above, or one shown by the general formula [6];
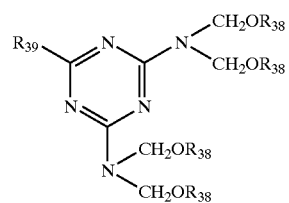
[6]
wherein $R_{38}$ is a hydrogen atom or an alkyl group, and $R_{39}$ is a hydrogen atom or a group shown by the general formula [7]:
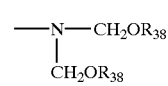
[7]
wherein $R_{38}$ has the same meaning as above.
* * * * *

UNITED STATES PATENT AND TRADEMARK OFFICE
CERTIFICATE OF CORRECTION

PATENT NO. : 6,586,152 B1
DATED : July 1, 2003
INVENTOR(S) : Urano et al.

It is certified that error appears in the above-identified patent and that said Letters Patent is hereby corrected as shown below:

Column 38,
Line 2, change "or" to -- to --
Line 5, change "or" to -- and --
Line 18, change "an" to -- and --

Column 46,
Line 35, change "$R_{12}$" to -- $R_{15}$ --

Column 50,
Line 8, change "formula [16] to -- formula [16] or [17] --
Line 10, change "[17]" to -- [16] --
Line 15, change "[18]" to -- [17] --

Signed and Sealed this

Seventeenth Day of February, 2004

JON W. DUDAS
*Acting Director of the United States Patent and Trademark Office*